US012812943B2

(12) United States Patent
Lin et al.

(10) Patent No.: US 12,812,943 B2
(45) Date of Patent: Nov. 24, 2026

(54) SRAM DEVICE HAVING CHANNEL LAYERS WITH VARYING DIMENSIONS AND MANUFACTURING METHODS THEREOF

(71) Applicant: TAIWAN SEMICONDUCTOR MANUFACTURING COMPANY, LTD., Hsinchu (TW)

(72) Inventors: Kao-Cheng Lin, Taipei City (TW); Cheng-Yin Wang, Taipei City (TW); Yen Lin Chung, Taipei City (TW); Wei Min Chan, New Taipei City (TW); Yen-Huei Chen, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 577 days.

(21) Appl. No.: 18/342,052

(22) Filed: Jun. 27, 2023

(65) Prior Publication Data

US 2025/0006815 A1 Jan. 2, 2025

(51) Int. Cl.

| | |
|---|---|
| ***H10D 64/01*** | (2025.01) |
| ***H10B 10/00*** | (2023.01) |
| ***H10D 30/01*** | (2025.01) |
| ***H10D 30/43*** | (2025.01) |
| ***H10D 30/67*** | (2025.01) |
| ***H10D 62/10*** | (2025.01) |

(Continued)

(52) U.S. Cl.

CPC ........... *H10D 64/017* (2025.01); *H10B 10/12* (2023.02); *H10D 30/014* (2025.01); *H10D 30/43* (2025.01); *H10D 30/6735* (2025.01); *H10D 30/6757* (2025.01); *H10D 62/121* (2025.01); *H10D 84/0167* (2025.01); *H10D 84/017* (2025.01); *H10D 84/038* (2025.01); *H10D 84/85* (2025.01)

(58) Field of Classification Search

CPC .... H10D 30/014; H10D 30/43; H10D 30/501; H10D 30/6735; H10D 84/85; H10D 88/00

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |

(Continued)

*Primary Examiner* — Sue A Purvis
*Assistant Examiner* — Emily Farmer
(74) *Attorney, Agent, or Firm* — Birch, Stewart, Kolasch & Birch, LLP

(57) ABSTRACT

A method includes forming a first bottom-tier transistor; forming a second bottom-tier transistor, the first and second bottom-tier transistors sharing a same source/drain region; forming a first top-tier transistor over the first bottom-tier transistor, the first top-tier transistor comprising a first channel layer and a first gate structure around the first channel layer; forming a second top-tier transistor over the second bottom-tier transistor, the second top-tier transistor comprising a second channel layer and a second gate structure around the second channel layer, the first and second top-tier transistors sharing a same source/drain region, wherein from a top view, a first dimension of the first channel layer in a lengthwise direction of the first gate structure is different than a second dimension of the second channel layer in the lengthwise direction of the first gate structure.

20 Claims, 23 Drawing Sheets

(51) Int. Cl.

| | |
|---|---|
| ***H10D 84/01*** | (2026.01) |
| ***H10D 84/03*** | (2025.01) |
| ***H10D 84/85*** | (2025.01) |

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2017/0194330 | A1* | 7/2017 | Lee | H10D 84/85 |
| 2020/0135740 | A1* | 4/2020 | Liaw | H10D 30/43 |
| 2021/0020643 | A1* | 1/2021 | Yang | H10D 30/6211 |
| 2022/0102362 | A1* | 3/2022 | Chanemougame | H10B 10/125 |
| 2023/0380130 | A1* | 11/2023 | Chou | H10D 30/6729 |

* cited by examiner

B-B'

A-A'

B-B'

A-A'

B-B'

A-A'

A-A'

B-B'

B-B'

A-A'

B-B'

A-A'

B-B'

A-A'

SRAM DEVICE HAVING CHANNEL LAYERS WITH VARYING DIMENSIONS AND MANUFACTURING METHODS THEREOF

BACKGROUND

As the semiconductor industry further progresses into sub-10 nanometer (nm) technology process nodes in pursuit of higher device density, higher performance, and lower costs, challenges from both fabrication and design issues have led to stacked device structure configurations, such as complementary field effect transistors (C-FET) where an n-type multi-gate transistor and a p-type multi-gate transistor are stacked vertically, one over the other. While existing C-FET structures are generally adequate, they are not satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
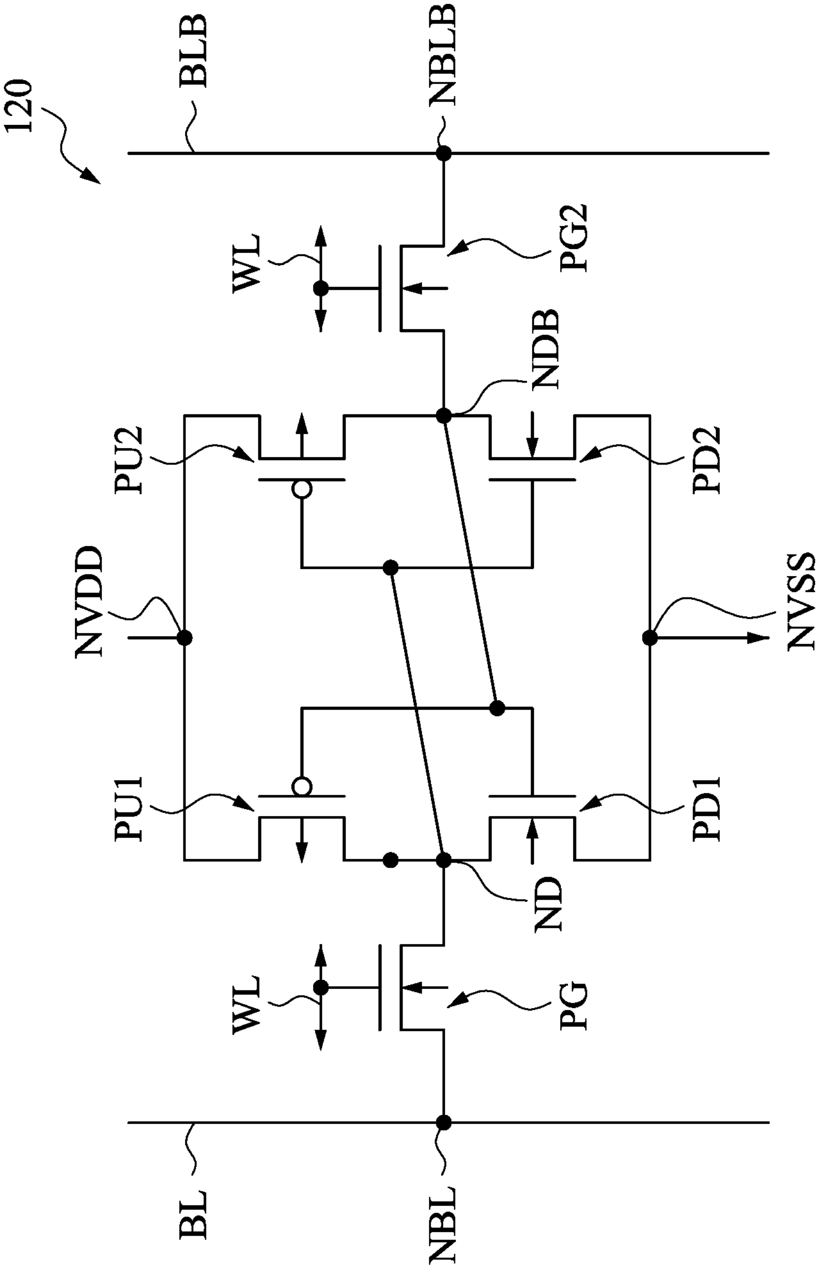
FIG. 1 illustrates a schematic circuit diagram of a memory cell in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to integrated circuit (IC) structures and methods of forming the same. More particularly, some embodiments of the present disclosure are related to gate-all-around (GAA) devices including improved isolation structures to reduce current leakage from channels to the substrate. A GAA device includes a device that has its gate structure, or portions thereof, formed on four-sides of a channel region (e.g., surrounding a portion of a channel region). The channel region of a GAA device may include nanosheet channels, bar-shaped channels, and/or other suitable channel configurations. In some embodiments, the channel region of a GAA device may have multiple horizontal nanosheets or horizontal bars vertically spaced, making the GAA device a stacked horizontal GAA (S-HGAA) device. The GAA devices presented herein include a p-type metal-oxide-semiconductor GAA device and an n-type metal-oxide-semiconductor GAA device stack together. Further, the GAA devices may have one or more channel regions (e.g., nanosheets) associated with a single, contiguous gate structure, or multiple gate structures. One of ordinary skill may recognize other examples of semiconductor devices that may benefit from aspects of the present disclosure. In some embodiments, the nanosheets can be interchangeably referred to as nanowires, nanoslabs, nanorings, or nanostructures having nano-scale size (e.g., a few nanometers), depending on their geometry. In addition, the embodiments of the disclosure may also be applied, however, to a variety of metal oxide semiconductor transistors (e.g., complementary-field effect transistor (CFET) and fin field effect transistor (FinFET)).

Some embodiments discussed herein are discussed in the context of nano-FETs formed using a gate-last process. In other embodiments, a gate-first process may be used. Also, some embodiments contemplate aspects used in planar devices, such as planar FETs, or in fin field-effect transistors (FinFETs). For example, FinFETs may include fins on a substrate, with the fins acting as channel regions for the FinFETs. Similarly, planar FETs may include a substrate, with portions of the substrate acting as channel regions for the planar FETs.

In the course of IC evolution, functional density (i.e., the number of interconnected devices per chip area) has generally increased while geometry size (i.e., the smallest component (or line) that can be created using a fabrication process) has decreased. A proposed solution for improving the functional density of the IC structure is to use a complementary FET (CFET), which involves stacking a p-type FET and an n-type FET vertically. However, this vertical stacked structure may limit the optimization of write margin, noise margin, alpha ratio, and beta ratio in a memory cell, as both the p-type and n-type FETs have the same dimensions. Therefore, the present disclosure in various embodiments provides a memory cell comprising a pass-gate transistor that has a greater channel width (referred to as an oxide definition (OD) jog) compared to the pull-up/pull-down transistor. This feature can improve Vt tuning and mobility tuning on the memory cell, resulting in more efficient memory operations. This technique can also be applied to other SRAM cell types, such as PMOS pass gate or multi-port SRAM.

Reference is made to FIG. 1. FIG. 1 illustrates a circuit diagram of a static random access memory (SRAM) cell 120 in accordance with some embodiments. The SRAM cell 120 may be a single port six-transistor (6T) SRAM cell illustrated as an example to have two pass-gate transistors PG1 and PG2, two pull-up transistors PU1 and PU2, two pull-down transistors PD1 and PD2. In some embodiments, the present disclosure can be applicable to a multiple-port SRAM cell having one or more write ports and/or one or more read ports. As shown in FIG. 1, the circuit diagram of the SRAM cell 120 can further include data nodes ND and NDB, a supply voltage node NVDD, a reference voltage node NVSS, a first bit line BL, a second bit line BLB, and a word line WL.

In FIG. 1, the pass-gate transistor PG1 is electrically coupled with the data node ND, the bit line BL, and the word line WL. The pass-gate transistor PG2 is electrically coupled with the data node NDB, the bit line BLB, and the word line WL. The pass-gate transistors PG1 and PG2 can be N-type metal oxide semiconductor field effect (NMOSFET) transistors or P-type metal oxide semiconductor field effect (PMOSFET) transistors. A drain of the pass-gate transistor PG1 is electrically coupled with the bit line BL at the node NBL. A source of the pass-gate transistor PG1 is electrically coupled with the data node ND. A drain of the pass-gate transistor PG2 is electrically coupled with the bit line BLB at the node NBLB. A source of the pass-gate transistor PG2 is electrically coupled with the data node NDB. A gate of the pass-gate transistor PG1 and a gate of the pass-gate transistor PG2 are electrically coupled with the word line WL. The gates of the pass-gate transistors PG1 and PG2 are control terminals thereof configured to receive a control signal for turning on or off the pass-gate transistors PG1 and PG2.

In some embodiments, the two pull-up transistors PU1 and PU2 can be PMOS transistors, and the two pull-down transistors PD1 and PD2 can be NMOS transistors. In some embodiments, the two pull-up transistors PU1 and PU2 can be NMOS transistors, and the two pull-down transistors PD1 and PD2 can be PMOS transistors. The pull-up transistors PU1 and PU2 and the pull-down transistors PD1 and PD2 form a cross latch having two cross-coupled inverters. The pull-up transistor PU1 and pull-down transistor PD1 form a first inverter while the pull-up transistor PU2 and pull-down transistor PD2 form a second inverter. Drains of the pull-up transistor PU1 and the pull-down transistor PD1 are coupled together and form the data node ND. Drains of the pull-up transistor PU2 and the pull-down transistor PD2 are coupled together and form the data node NDB. Gates of the pull-up transistor PU1 and the pull-down transistor PD are coupled together and to the drains of the pull-up transistor PU2 and the pull-down transistor PD2. Gates of the pull-up transistor PU2 and the pull-down transistor PD2 are coupled together and to the drains of the pull-up transistor PU1 and the pull-down transistor PD1. Sources of the pull-up transistors PU1 and PU2 are coupled with the supply voltage node NVDD. In some embodiments, the supply voltage node NVDD is configured to receive a supply voltage VDD. The sources of the pull-down transistors PD1 and PD2 are coupled with the reference voltage node NVSS1. In some embodiments, the reference voltage node NVSS is configured to receive a ground reference voltage VSS. In some embodiments, each of the pass-gate transistors PG1 and PG2 has a first threshold voltage Vt1, and each of the pull-up transistors PU1 and PU2 has a second threshold voltage Vt2.

Figure 2A:
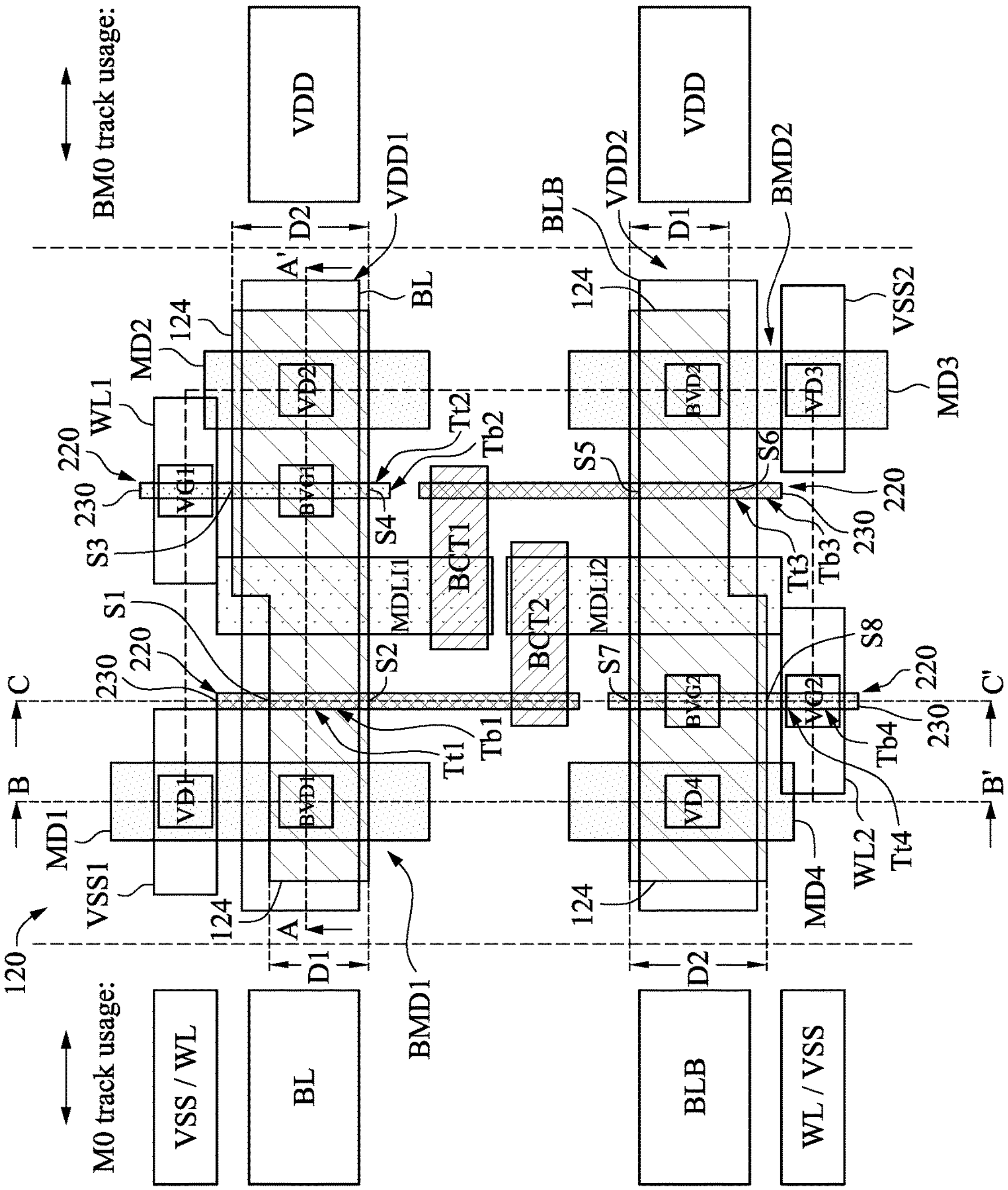
FIGS. 2A-2D illustrate cell array layout diagrams of a circuit according to some embodiments of the present disclosure.

Reference is made to FIG. 2A. FIG. 2A illustrates a cell array layout diagram of the SRAM cell 120 according to some embodiments of the present disclosure. As shown in FIG. 2A, the SRAM cell 120 may include a plurality of transistors Tb1, Tb2, Tb3, Tb4, Tt1, Tt2, Tt3, and Tt4. The transistor Tt1 is formed over the transistor Tb1, the transistor Tt2 is formed over the transistor Tb2, the transistor Tt3 is formed over the transistor Tb3, and the transistor Tt4 is formed over the transistor Tb4. In some embodiments, the transistors Tb1, Tb2, Tb3, and Tb4 can be interchangeably referred to as bottom-tier transistors, and the transistors Tt1, Tt2, Tt3, and Tt4 can be interchangeably referred to as top-tier transistors.

By way of example and not limitation, one of the transistors Tb1 and Tt1 can be a pull-up transistor, and another one of the transistors Tb1 and Tt1 can be a pull-down transistor. In addition, the choice of transistor type depends on the specific requirements of the circuit and the design constraints. For example, in the SRAM cell 120, the transistors Tb1 and Tt1 can be opposite conductivity type (i.e. one is p-type and the other is n-type). This is because the transistors Tb1 and Tt1 can form a cross-coupled inverter, which is a building block of the SRAM cell 120. The cross-coupled inverter consists of the transistors Tb1 and Tt1 that are connected in a positive feedback loop. When one of the transistors Tb1 and Tt1 is turned on, it drives the output of the inverter to the opposite logic level, which turns on the other one of the transistors Tb1 and Tt1 and turns off the one of the transistors Tb1 and Tt1. This causes the output to flip to the opposite logic level. The cross-coupled inverter latches the data that is stored in the SRAM cell 120. To form a cross-coupled inverter, the transistors Tb1 and Tt1 must have opposite conductivity types, because they must be able to conduct current in opposite directions to form the positive feedback loop. Similarly, one of the transistors Tb3 and Tt3 can be a pull-up transistor, and another one of the transistors Tb3 and Tt3 can be a pull-down transistor.

The transistors Tb2, Tt2, Tb4, and Tt4 can be pass-gate transistors. In the SRAM cell 120, the transistors Tb2, Tt2, Tb4, and/or Tt4 can be either a p-type or an n-type transistor, depending on the design of the circuit. In some embodiments, the transistors Tb2 and Tb4 may be tie-off dummy transistors. The transistors Tb2, Tt2, Tb4, and Tt4 can be responsible for controlling the access to the storage node of the SRAM cell 120. It acts as a switch that allows the storage node to be connected to either the bit line or the complementary bit line. When the transistors Tb2, Tt2, Tb4, and/or Tt4 is turned on, the contents of the storage node can be read or written to. In the SRAM cell 120, the storage node is typically implemented using a pair of cross-coupled inverters, which form a latch. Each of the transistors Tb2, Tt2, Tb4, and Tt4 is connected between the storage node and the bit line or complementary bit line.

As shown in FIG. 2A, the transistor Tb1, Tb2, Tb3, Tb4, Tt1, Tt2, Tt3, and Tt4 in the SRAM cell 120 can be formed with silicon channel regions. In some embodiments, the transistors Tb1, Tb2, Tb3, Tb4, Tt1, Tt2, Tt3, and Tt4 may be GAA FETs. The silicon channel regions of the NMOSFET and/or PMOSFET transistors are formed by semiconductor sheets 124. The semiconductor sheets 124 are stacked along the Z-direction (not shown), and the Z-direction is perpendicular to the plane formed by the X-direction and Y-direction. The SRAM cell 120 further includes gate electrodes 230 and gate electrodes 220 (see FIG. 8A) undying the gate structures 230, and the gate structures 220 and 230 wrap around the semiconductor sheets 124. The gate structures 220 and 230 extend in the Y-direction and in parallel with each other. In some embodiments, the gate electrodes 220 and 230 can be interchangeably referred to as gates, gate structures, gate strips, or gate patterns. The SRAM cell 120 further includes source/drain regions 180 and 185 (see FIGS. 8A and 8B) on opposite sides of the semiconductor sheets 124. Specifically, the source/drain regions 180 are on opposite sides of the of the semiconductor sheets 124 in the transistors Tb1, Tb2, Tb3, and Tb4, and the source/drain regions 185 are on opposite sides of the of the semiconductor sheets 124 in the transistors Tt1, Tt2, Tt3, and Tt4. In some embodiments, the source/drain regions 180 and 185 can be interchangeably referred to as source/drain structures, source/drain patterns, epitaxial structures, or epitaxial patterns.

As shown in FIG. 2A, front-side source/drain contacts MD1, MD2, MD3, and MD4 can be formed over front-sides of the source/drain regions 185 (see FIGS. 9A and 9B) of the transistors Tt1, Tt2, Tt3, and Tt4. Specifically, the front-side source/drain contact MD1 can be formed on the front-side of the source/drain region 185 of the transistor Tt1 at a side of the transistor Tt1 opposite to the transistor Tt2, the front-side source/drain contact MD2 can be formed on the front-side of the source/drain region 185 of the transistor Tt2 at a side of the transistor Tt2 opposite to the transistor Tt1, the front-side source/drain contact MD3 can be formed on the front-side of the source/drain region 185 of the transistor Tt3 at a side of the transistor Tt3 opposite to the transistor Tt4, and the front-side source/drain contact MD4 can be formed on the front-side of the source/drain region 185 of the transistor Tt4 at a side of the transistor Tt4 opposite to the transistor Tt4. In some embodiments, the front-side source/drain contacts MD1, MD2, MD3, and MD4 can be interchangeably referred to as metal-like defined (MD) contacts. Front-side source/drain vias VD1, VD2, VD3, and VD4 can be formed over the front-side source/drain contacts MD1, MD2, MD3, and MD4.

As shown in FIG. 2A, front-side metal lines VSS1 and VSS2 can be formed on the source/drain vias VD1 and VD3 and extend in the X-direction. In some embodiments, the front-side metal lines VSS1 and VSS2 are power supply connections for the SRAM cell 120 that can provide the negative voltage level to the circuit. In some embodiments, the front-side metal lines VSS1 and VSS2 can be connected to the pull-down transistors. In some embodiments, the front-side metal line VSS1 and/or VSS2 can be interchangeably referred to as a power supply voltage line and/or a ground line.

A front-side metal line BL can be formed over the source/drain via VD2 and extend in the X-direction. The front-side metal line BL is a signal line that is used to read and write data from/to the SRAM cell 120. During a read operation, the stored data is sensed on the front-side metal line BL. During a write operation, the data to be written is driven onto the front-side metal line BL. In some embodiments, the front-side metal line BL can be interchangeably referred to as a bit line.

A front-side metal line BLB can be formed over the source/drain via VD4 and extend in the X-direction. The front-side metal line BLB is a complementary signal line to the front-side metal line BL, which is used to improve the noise margin of the read operation. During a read operation, the front-side metal line BLB is precharged to the complement of the front-side metal line BL. The differential voltage between the front-side metal lines BL and BLB is used to sense the stored data. In some embodiments, the front-side metal line BLB can be interchangeably referred to as a bar bit line.

As shown in FIG. 2A, front-side gate vias VG1 and VG2 can be formed over front-sides of the gate structures 230. Specifically, the front-side gate via VG1 can be formed on the front-side of the gate structure 230 of the transistor Tt2, and the front-side gate via VG2 can be formed on the front-side of the gate structure 230 of the transistor Tt4. The front-side metal lines WL1 and WL2 can be formed on the front-side gate vias VG1 and VG2. The front-side metal lines WL1 and WL2 are control signal lines that can be used to select the SRAM cell 120 for a read or write operation. When the front-side metal lines WL1 and WL2 are activated, it enables the access transistors to connect the front-side metal lines BL and BLB to the SRAM cell 120. During a write operation, the front-side metal lines WL1 and WL2 can be used to drive the data into the SRAM cell 120. During a read operation, the front-side metal lines WL1 and WL2 can be used to sense the stored data on the front-side metal lines BL and BLB. In some embodiments, the front-side metal lines WL1 and WL2 can be interchangeably referred to as word lines.

As shown in FIG. 2A, vertical local interconnects MDLI1 and MDLI2 can be formed over front-sides of the source/drain regions 185 between the transistors Tt1 and Tt2 and between the transistors Tt3 and Tt4. A butted contact BCT1 can be formed to connect the vertical local interconnect MDLI1 to the gate structure 230 of the transistor Tt3, and a butted contact BCT2 can be formed to connect the vertical local interconnect MDLI2 to the gate structure 230 of the transistor Tt1.

As shown in FIG. 2A, back-side source/drain contacts BMD1 and BMD2 can be formed over back-sides of the source/drain regions 180 (see FIGS. 14A and 14B) of the transistors Tb1 and Tb4. Specifically, the back-side source/drain contact BMD1 can be formed on the back-side of the source/drain region 180 of the transistor Tt1 at a side of the transistor Tb1 opposite to the transistor Tb2, and the back-side source/drain contact BMD2 can be formed on the back-side of the source/drain region 180 of the transistor Tt4 at a side of the transistor Tb4 opposite to the transistor Tb3. Back-side source/drain vias BVD1 and BVD2 can be formed over the back-side source/drain contacts BMD1 and BMD2.

As shown in FIG. 2A, the back-side metal lines VDD can be formed on the back-side source/drain vias BVD1 and BVD2 and extend in the X-direction. In some embodiments, the back-side metal lines VDD are under the front-side metal lines BL and BLB. The back-side metal lines VDD are the positive power supply voltage that is applied to the SRAM cell 120. It provides the energy needed to operate the transistors and the associated circuitry. In some embodiments, the front-side metal lines VSS1 and VSS2 can be connected to the pull-up transistors. In some embodiments, the back-side metal lines VDD can be interchangeably referred to as power supply voltage lines.

Figure 8B:
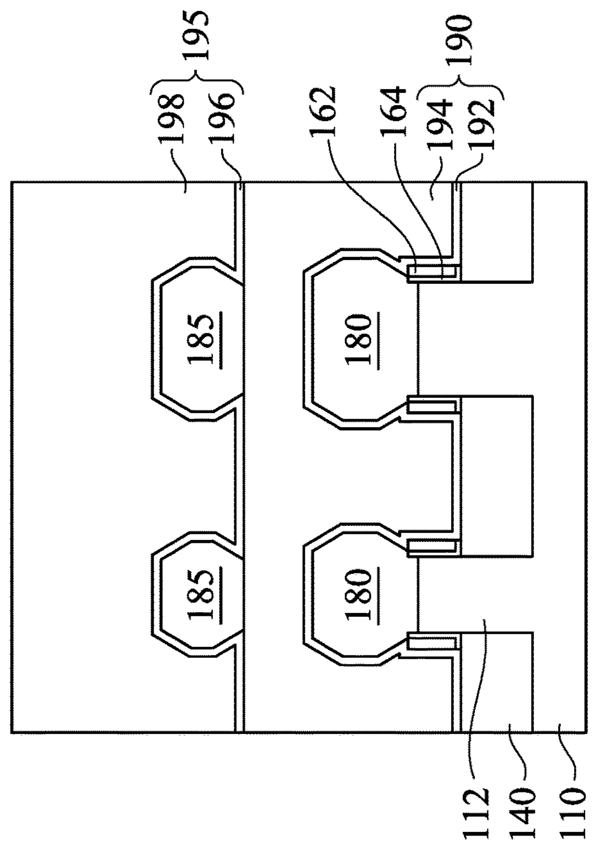
Figure 8A:
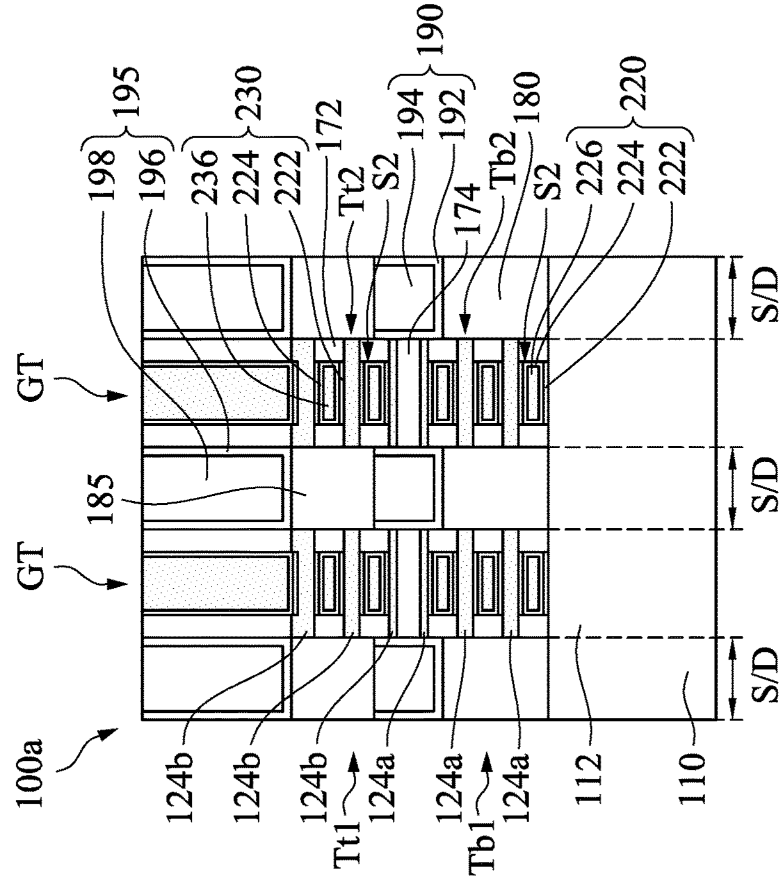

In some embodiments, back-side gate vias BVG1 and BVG2 can be formed on back-sides of the gate structures 220 (see FIG. 8A). Specifically, the back-side gate via BVG1 can be formed on the back-side of the gate structure 220 of the transistor Tb2, and the back-side gate via VG2 can be formed on the back-side of the gate structure 220 of the transistor Tb4. In some embodiments, the back-side gate vias BVG1 and BVG2 can be formed to tie-off dummy transistors. In some embodiments, gate isolations (not shown), such as gate-cut structures, can be formed on opposite ends of the gate structures 220 and 230, and the gate-cut structure is formed by, such as a cut metal gate (CMG) process.

In the course of IC evolution, functional density (i.e., the number of interconnected devices per chip area) has generally increased while geometry size (i.e., the smallest component (or line) that can be created using a fabrication process) has decreased. A proposed solution for improving the functional density of the IC structure is to use a complementary FET (CFET), which involves stacking a p-type FET and an n-type FET vertically. However, this vertical stacked structure may limit the optimization of write margin, noise margin, alpha ratio, and beta ratio in the SRAM cell 120, as both the p-type and n-type FETs have the same dimensions. Therefore, the present disclosure in various embodiments provides the SRAM cell 120 comprising the pass-gate transistors (e.g. transistor Tb2, Tt2, Tb4, and Tt4) that can have different dimensions, such as a different width on the semiconductor sheets 124 (referred to as an oxide definition (OD) jog), compared to the pull-up transistors and pull-down transistors (e.g., transistor Tb1, Tt1, Tb3, and Tt3) This feature can improve Vt tuning and mobility tuning on the SRAM cell 120, resulting in more efficient memory operations. This technique can also be applied to other SRAM cell types, such as PMOS pass gate or multi-port SRAM.

In the SRAM cell 120, the pass-gate transistors (e.g. transistor Tb2, Tt2, Tb4, and Tt4) are responsible for allowing the access to the SRAM cell 120, and the pull-up and pull-down transistors (e.g., transistor Tb1, Tt1, Tb3, and Tt3) are responsible for holding and amplifying the stored data. When a read or write operation is performed, the pass-gate transistor enables or disables the connection between the cell and the bit-line. The pull-up and pull-down transistors, on the other hand, are responsible for maintaining the state of the SRAM cell 120 during operation. In some embodiments, when the width of the semiconductor sheet 124 of the pass-gate transistor is larger than the width of the pull-up/pull-down transistor, it can improve the performance of the SRAM cell 120. For example, firstly, it can help reduce the effects of leakage current, which can occur due to small variations in transistor dimensions or temperature changes. By increasing the channel width of the pass-gate transistor, the resistance of the semiconductor sheet 124 can be reduced, which can decrease the overall leakage current of the SRAM cell 120. Secondly, a larger channel width for the pass-gate transistor can help to improve the transistor's on-state resistance (Ron) and off-state resistance (Roff) characteristics, leading to a better signal-to-noise ratio and faster operation. This can be achieved by better controlling the threshold voltage (Vt) and mobility tuning of the transistor.

On the other hand, by reducing the widths of the semiconductor sheet 124 of the pull-up and pull-down transistors (e.g., transistor Tb1, Tt1, Tb3, and Tt3) compared to the pass-gate transistor (e.g. transistor Tb2, Tt2, Tb4, and Tt4), the resistance of these transistors is increased, resulting in a faster discharge time during the write operation and a faster amplification time during the read operation. This improves the performance of the SRAM cell 120 by reducing the access time and increasing the operating speed. Moreover, reducing the width of the pull-up and pull-down transistors reduces their capacitance, which results in a lower power consumption and better noise immunity. Therefore, by rendering the different widths of the semiconductor sheet 124 between the pass-gate transistor and the pull-up/pull-down transistors in the SRAM cell 120, the performance of the SRAM cell 120 can be improved in terms of speed, power consumption, and noise immunity. In addition, the larger width of the semiconductor sheet 124 of the pass-gate transistor can improve the efficiency of the SRAM cell 120 by reducing leakage current, improving resistance characteristics, and enhancing the control of Vt and mobility tuning.

As shown in FIG. 2A, from the top view, a dimension D1 (e.g. width) of the semiconductor sheet 124 on the pull-up/pull-down transistor (e.g., transistor Tb1, Tt1, Tb3, and/or Tt3) in the lengthwise direction of the gate structure 230 is different than a dimension D2 (e.g. width) of the semiconductor sheet 124 on the pass-gate transistor (e.g., transistor Tb2, Tt2, Tb4, and/or Tt4) in the lengthwise direction of the gate structure 230. Specifically, the dimension D2 is greater than the dimension D1. In some embodiments, the dimension D2 of the semiconductor sheet 124 of the transistor Tb2, Tt2, Tb4, and/or Tt4 is about 1.1 to about 2 (e.g. about 1.1, 1.2, 1.3, 1.4, 1.5, 1.6, 1.7, 1.8, 1.9, or 2) times the dimension D1 of the semiconductor sheet 124 of the transistor Tb1, Tt1, Tb3, and/or Tt3. In some embodiments, in the same transistor stack, the semiconductor sheet 124 on the pull-up transistor (e.g., a corresponding one of the transistor Tb1, Tt1, Tb3, and/or Tt3) has a same dimension as the pull-down transistor (e.g., another corresponding one of the transistor Tb1, Tt1, Tb3, and/or Tt3). The semiconductor sheet 124 on the pass-gate transistors (e.g., the transistor Tb2, Tt2, Tb4, and Tt4) in a transistor same stack can have a same dimension.

In FIG. 2A, the semiconductor sheet 124 of the transistor Tb1 or Tt1 (i.e., pull-up or pull-down transistor) has opposite sides S1 and S2, the semiconductor sheet 124 of the transistor Tb3 or Tt3 (i.e., pull-up or pull-down transistor) has opposite sides S5 and S6, and the sides S1, S2, S5, and S6 extend along a direction perpendicular to the lengthwise direction of the gate structure 230. The semiconductor sheet 124 of the transistor Tb2 or Tt2 (i.e., pass-gate transistor) has opposite sides S3 and S4, the semiconductor sheet 124 of the transistor Tb4 or Tt4 (i.e., pass-gate transistor) has opposite sides S7 and S8, and the sides S3, S4, S7, and S8 extend along the perpendicular to the lengthwise direction of the gate structure 230. The side S1 is inward relative to the side S3 in the lengthwise direction of the gate structure 230, and the side S2 is aligned with the side S4. The side S6 is inward relative to the side S8 in the lengthwise direction of the gate structure 230, and the side S5 is aligned with the side S7. From the top view, the inward side S1 is between the aligned side S2 and the front-side source/drain via VD1, and the inward side S6 is between the aligned side S5 and the front-side source/drain via VD3. In the memory unit, the side of the semiconductor sheet 124 near the boundary of the SRAM cell 120 can be interchangeably referred to as a top edge, while the side of the semiconductor sheet 124 far from the boundary of the SRAM cell 120 can be interchangeably referred to as a bottom edge.

Figure 2B:
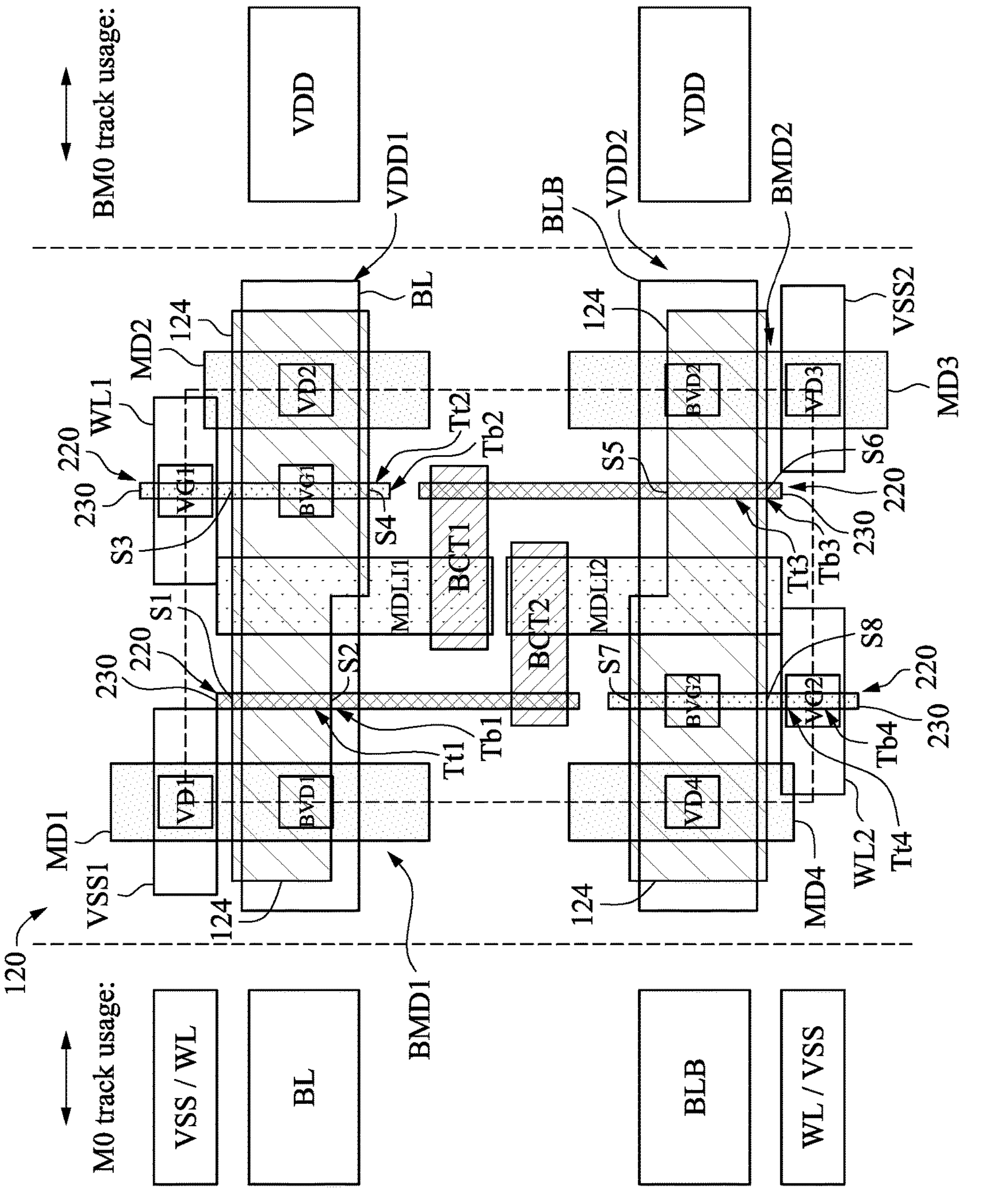
Figure 2C:
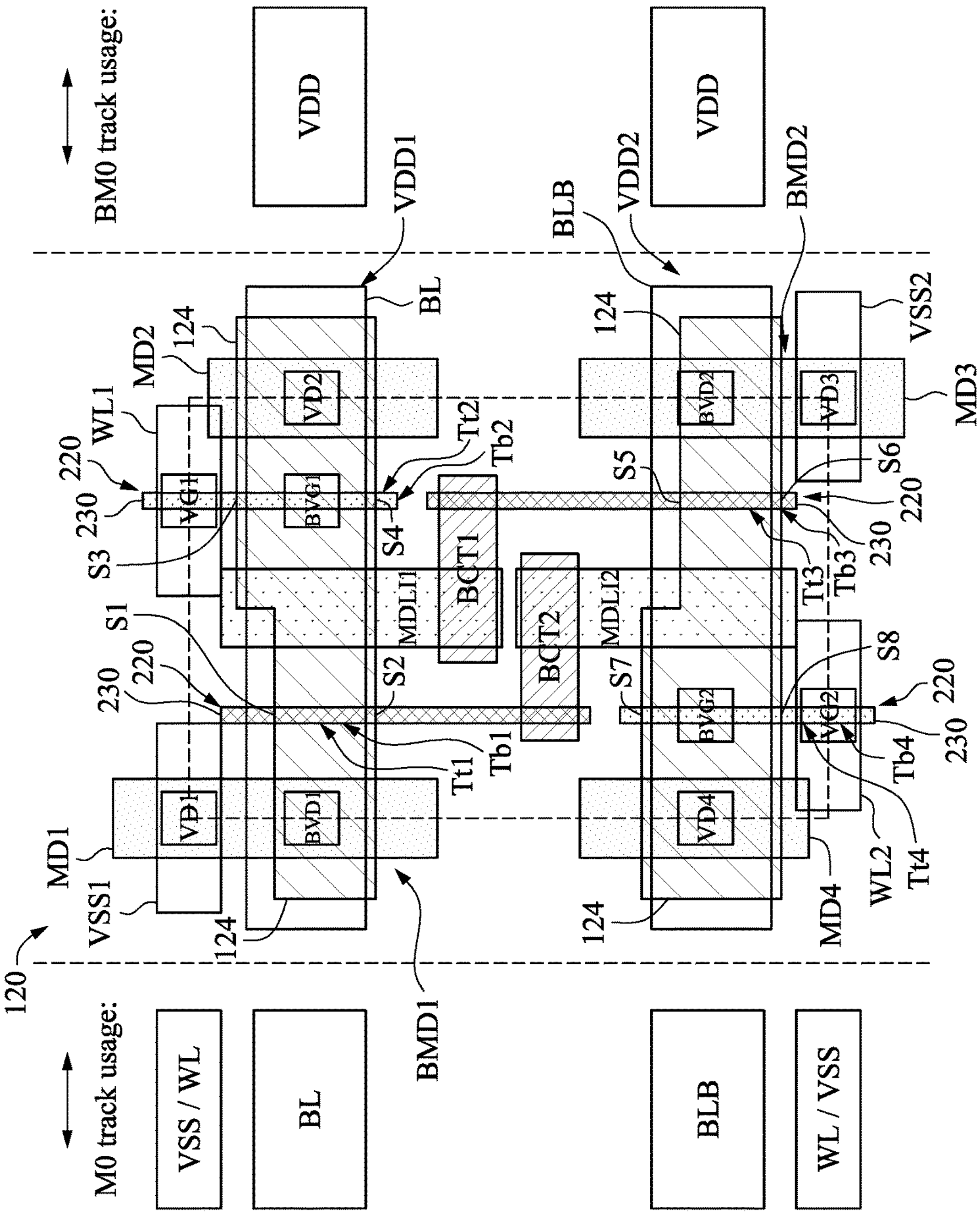
Figure 2D:
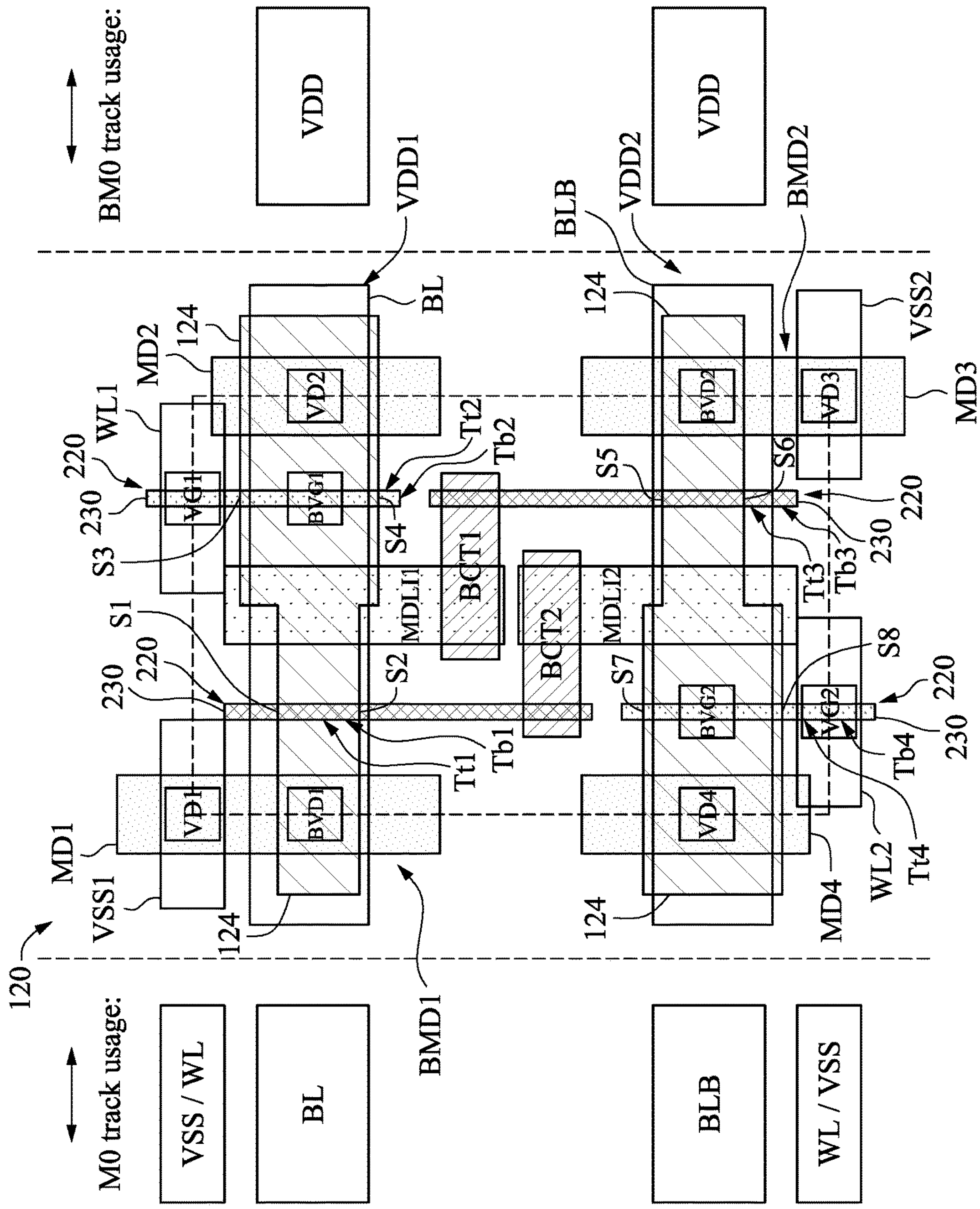

Reference is made to FIGS. 2B-2D. FIGS. 2B-2D illustrate cell array layout diagrams of a circuit according to some embodiments of the present disclosure. While FIGS. 2B-2D show embodiments of semiconductor structures with different semiconductor sheet top view profiles than the semiconductor structure in FIG. 2A. In addition, the present disclosure may repeat reference numerals and/or letters in the various examples. This repetition is for the purpose of simplicity and clarity and does not in itself dictate a relationship between the various embodiments and/or configurations discussed.

As shown in FIG. 2B, the difference between the embodiment in FIG. 2B and the embodiment in FIG. 2A is in that the side S1 is aligned with the side S3 in the lengthwise direction of the gate structure 230, and the side S2 is inward relative to the side S4. The side S6 is aligned with the side S8 in the lengthwise direction of the gate structure 230, and the side S5 is inward relative to the side S7. From the top view, the aligned side S1 is between the inward side S2 and the front-side source/drain via VD1, and the aligned side S6 is between the inward side S5 and the front-side source/drain via VD2.

As shown in FIG. 2C, the difference between the embodiment in FIG. 2C and the embodiment in FIG. 2A is in that the side S6 is aligned with the side S8 in the lengthwise direction of the gate structure 230, and the side S5 inward relative to the side S7. From the top view, the aligned side S6 is between the inward side S5 and the front-side source/drain via VD3.

As shown in FIG. 2D, the side S2 is inward relative to the side S4, and the side S5 is inward relative to the side S7. From the top view, the inward side S1 is between the inward side S2 and the front-side source/drain via VD1, and the inward side S6 is between the inward side S5 and the front-side source/drain via VD3.

Reference is made to FIGS. 3A-14B. FIGS. 3A, 4A, 5A, 6A, 7A, 8A, 9A, 10A, 11A, 12A, 13A, and 14A illustrate cross-sectional views of intermediate stages in the formation of a semiconductor structure 100*a* obtained from the reference cross-section A-A' in FIG. 2A in accordance with some embodiments of the present disclosure. FIGS. 3B, 4B, 5B, 6B, 7B, 8B, 9B, 10B, 11B, 12B, 13B, and 14B illustrate cross-sectional views of intermediate stages in the formation of the semiconductor structure 100*a* obtained from the reference cross-section B-B' in FIG. 2A in accordance with some embodiments of the present disclosure. FIGS. 3C, 4C, 5C, 6C, 7C, and 8C illustrate cross-sectional views of intermediate stages in the formation of the semiconductor structure 100*a* obtained from the reference cross-section C-C' in FIG. 2A in accordance with some embodiments of the present disclosure.

Figure 3B:
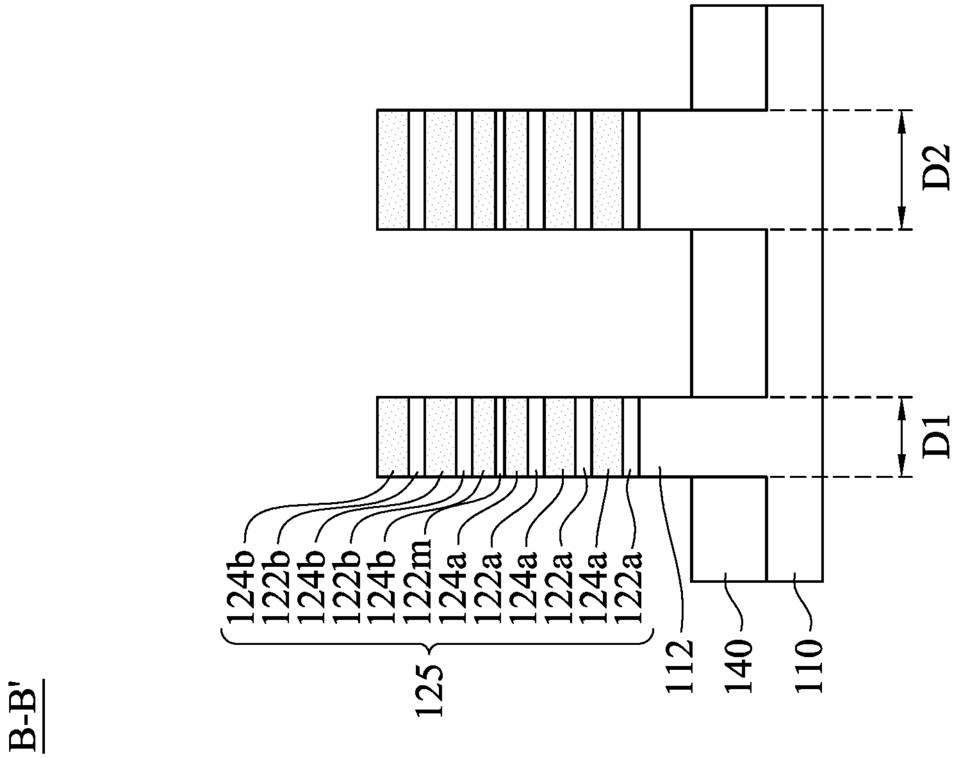
FIGS. 3A-14B illustrate schematic views of intermediate stages of semiconductor structures in accordance with some embodiments of the present disclosure.
Figure 3A:
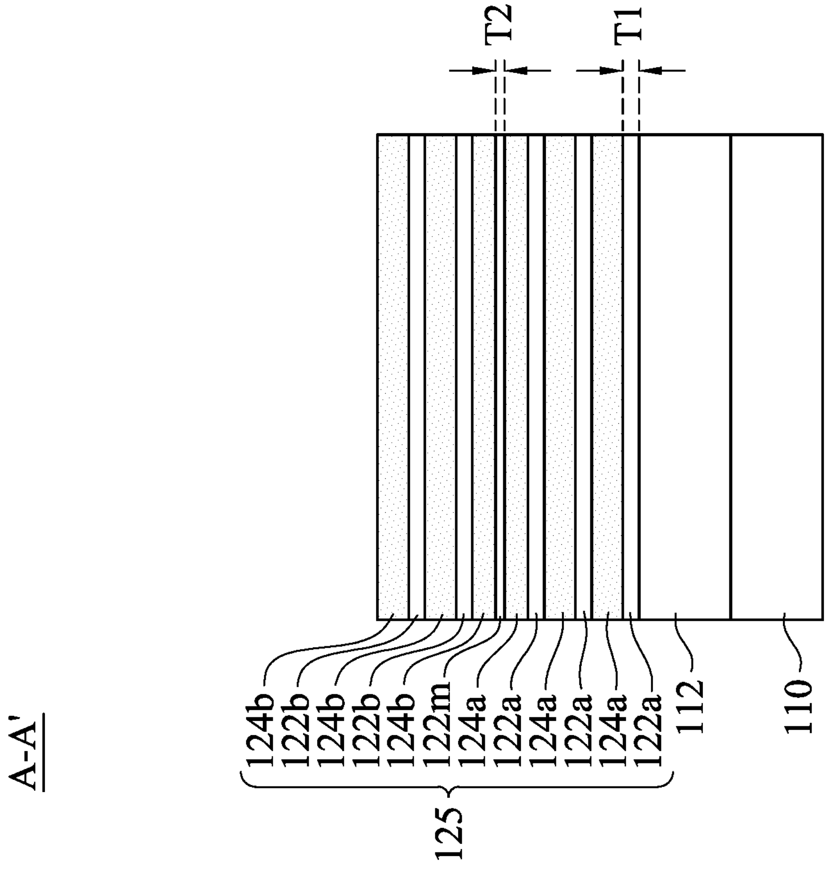
Figure 3C:
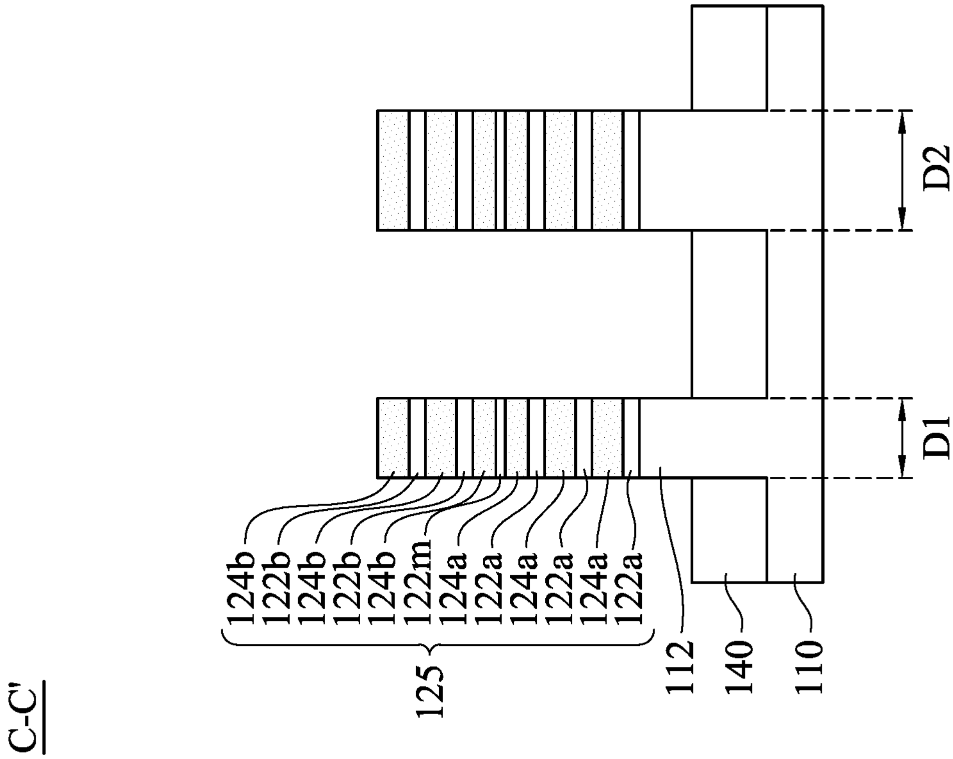

Reference is made to FIGS. 3A-3C. An epitaxial stack is formed over a substrate 110. In some embodiments, the substrate 110 may include silicon (Si). Alternatively, the substrate 110 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or a combination thereof) or other appropriate semiconductor materials. In some embodiments, the substrate 110 may include a semiconductor-on-insulator (SOI) structure such as a buried dielectric layer. Also alternatively, the substrate 110 may include a buried dielectric layer 111 such as a buried oxide (BOX) layer, such as that formed by a method referred to as separation by implantation of oxygen (SIMOX) technology, wafer bonding, SEG, or another appropriate method.

The epitaxial stack includes epitaxial layers 122*a*, 122*b*, 122*m* of a first composition interposed by epitaxial layers 124*a*, 124*b* of a second composition. The first and second compositions can be different. In some embodiments, the epitaxial layers 122*a*, 122*b*, 122*m* may be made of SiGe, and the epitaxial layers 124*a*, 124*b* may be made of silicon (Si). However, other embodiments are possible including those that provide for a first composition and a second composition having different etch selectivity.

The epitaxial layers 124*a* and 124*b* or portions thereof may form nanostructure channel(s) of the nanostructure transistor. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. For example, the nanostructures are nanosheets, nanowires, nanoslabs, or nanorings, depending on their geometry. The use of the epitaxial layers 124*a* and 124*b* to define a channel or channels of a device is further discussed below. In FIGS. 3A and 3B, the epitaxial layers 124*b* are disposed above the epitaxial layers 124*a*. It is noted that three layers of the epitaxial layers 124*a* and three layers of the epitaxial layers 124*b* are arranged as illustrated in FIGS. 3A and 3B, which is for illustrative purposes only and not intended to be limiting beyond what is specifically recited in the claims. It can be appreciated that any number of epitaxial layers can be formed in the epitaxial stack; the number of layers depending on the desired number of channels regions for the transistor. In some embodiments, the number of each of the epitaxial layers 124*a* and 124*b* can be between 2 and 10.

The epitaxial layers 122*a* are interposed by the epitaxial layers 124*a*, the epitaxial layers 122*b* are interposed by the epitaxial layers 124*b*, and the epitaxial layer 122*m* is between the epitaxial layers 124*a* and 124*b*. In some embodiments, the epitaxial layers 122*a* and 122*b* have substantially the same thickness T1 (e.g. vertical dimension), and the epitaxial layer 122*m* has a thickness T2 (e.g. vertical dimension) less than the thickness T1. In some embodiments, the thickness T2 is determined by the thickness of the isolation structure 190 (see FIG. 7A) and is in a range of about 20 nm to about 1000 nm. In some embodiments, the epitaxial layer 122*m* has a greater germanium atomic concentration than the epitaxial layers 122*a* and 122*b*.

As described in more detail below, the epitaxial layers 124*a* and 124*b* may serve as channel region(s) for a subsequently-formed semiconductor device and the thickness is chosen based on device performance considerations. The epitaxial layers 122*a*, 122*b*, and 122*m* in channel regions(s) may eventually be removed and serve to define a vertical distance between adjacent channel region(s) for a subsequently-formed multi-gate device and the thickness is chosen based on device performance considerations. Accordingly, the epitaxial layers 122*a*, 122*b*, and 122*m* may also be referred to as sacrificial layers, and epitaxial layers 124*a* and 124*b* may also be referred to as channel layers. In some embodiments, the epitaxial layers 124*a* and 124*b* can be interchangeably referred to as channel regions or channel patterns.

By way of example, epitaxial growth of the layers of the epitaxial stack may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 124*a* and 124*b* include the same material as the substrate 110. In some embodiments, the epitaxial layers 122*a*, 122*b*, 122*m* and 124*a*, 124*b* include a different material than the substrate 110. As stated above, in at least some examples, the epitaxial layers 122*a*, 122*b*, and 122*m* include an epitaxially grown silicon germanium (SiGe) layer and the epitaxial layers 124*a* and 124*b* include an epitaxially grown silicon (Si) layer. Alternatively, in some embodiments, either of the epitaxial layers 122*a*, 122*b*, 122*m* and 124*a*, 124*b* may include other materials such as germanium, tin, a compound semiconductor such as silicon carbide, gallium arsenide, gallium phosphide, indium phosphide, indium arsenide, and/or indium antimonide, an alloy semiconductor such as SiGe, GeSn, GaAsP, AlInAs, AlGaAs, InGaAs, GaInP, and/or GaInAsP, III-V, or combinations thereof. As discussed, the materials of the epitaxial layers 122*a*, 122*b*, 122*m* and 124*a*, 124*b* may be chosen based on providing differing oxidation and/or etching selectivity properties.

In FIGS. 3A and 3B, at least one fin structure 125 extending from the substrate 110 is formed. In various embodiments, the fin structure 125 includes a protruding portion 112 formed from the substrate 110 and portions of each of the epitaxial layers of the epitaxial stack including epitaxial layers 122*a*, 122*b*, 122*m* and 124*a*, 124*b*. The fin structure 125 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin structure 125 by etching the epitaxial stack. The etching process can include dry etching, wet etching, reactive ion etching (RIE), and/or other suitable processes. Subsequently, an etch process forms trenches 102 into the substrate 110, thereby leaving the fin structure 125. The trenches 102 may be etched using a dry etch (e.g., reactive ion etching), a wet etch, and/or combination thereof. Numerous other embodiments of methods to form the fins on the substrate may also be used including, for example, defining the fin region (e.g., by mask or isolation regions) and epitaxially growing the epitaxial stack in the form of the fin structure 125.

In some embodiments, the dimension D1 of the epitaxial layers 124*a* and 124*b* of the pull-up/pull-down transistor formed subsequently (e.g., transistor Tb1, Tt1, Tb3, and/or Tt3 as shown in FIG. 8A) is different than the dimension D2 of the epitaxial layers 124*a* and 124*b* of the pass-gate transistor formed subsequently (e.g., transistor Tb2, Tt2, Tb4, and/or Tt4 as shown in FIG. 8A). Specifically, the dimension D2 is greater than the dimension D1. In some embodiments, the dimension D2 is about 1.1 to about 2 (e.g. about 1.1, 1.2, 1.3, 1.4, 1.5, 1.6, 1.7, 1.8, 1.9, or 2) times the dimension D1. In some embodiments, in the same transistor stack, the epitaxial layers 124*a* and 124*b* on the pull-up transistor formed subsequently (e.g., a corresponding one of the transistor Tb1, Tt1, Tb3, and/or Tt3 as shown in FIG. 8A) has a same dimension D1 as the pull-down transistor formed subsequently (e.g., another corresponding one of the transistor Tb1, Tt1, Tb3, and/or Tt3 as shown in FIG. 8A). The epitaxial layers 124*a* and 124*b* on the pass-gate transistors (e.g., the transistor Tb2, Tt2, Tb4, and Tt4 as shown in FIG. 8A) in a same transistor stack can have a same dimension D2.

Next, as illustrated in FIGS. 3A and 3B, isolation structures 140 are formed to surround the fin structure 125. The isolation structures 140 may include a liner oxide (not shown). The liner oxide may be formed of a thermal oxide formed through a thermal oxidation of a surface layer of the substrate 110. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). The isolation structures 140 may also include a dielectric material over the liner oxide, and the dielectric material may be formed using flowable chemical vapor deposition (FCVD), spin-on coating, or the like. Subsequently, the isolation structures 140 are recessed, so that the top portion of the fin structure 125 protrudes higher than the top surfaces of the neighboring isolation structures 140. The etching may be performed using a dry etching process, wherein $NH_3$ and $NF_3$ are used as the etching gases. During the etching process, plasma may be generated. Argon may also be included. In accordance with alternative embodiments of the present disclosure, the recessing of the isolation structures 140 is performed using a wet etch process. The etching chemical may include diluted HF, for example.

Figure 4B:
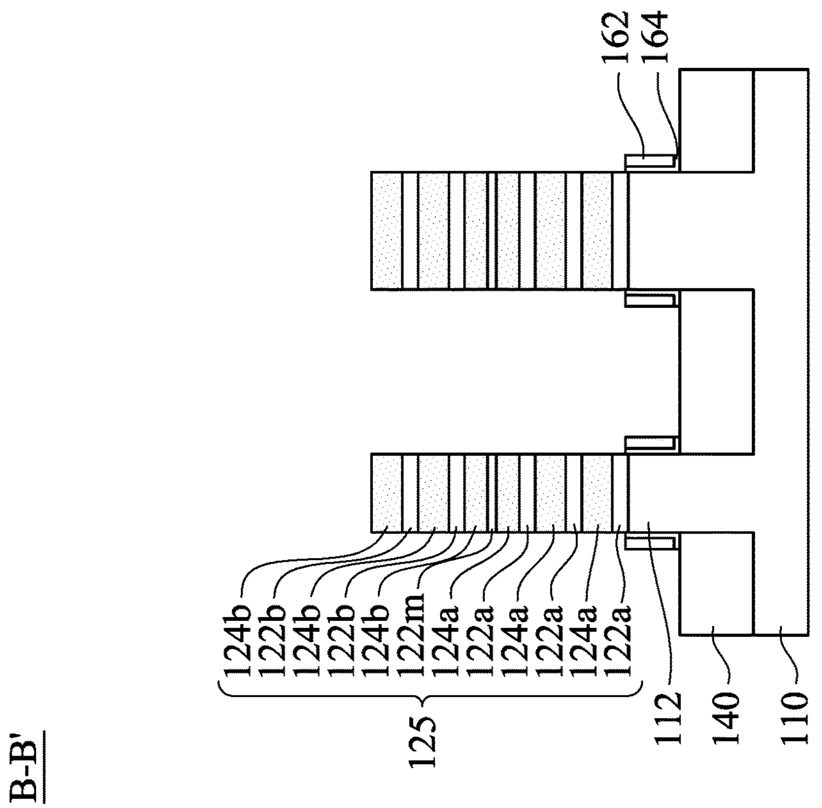
Figure 4A:
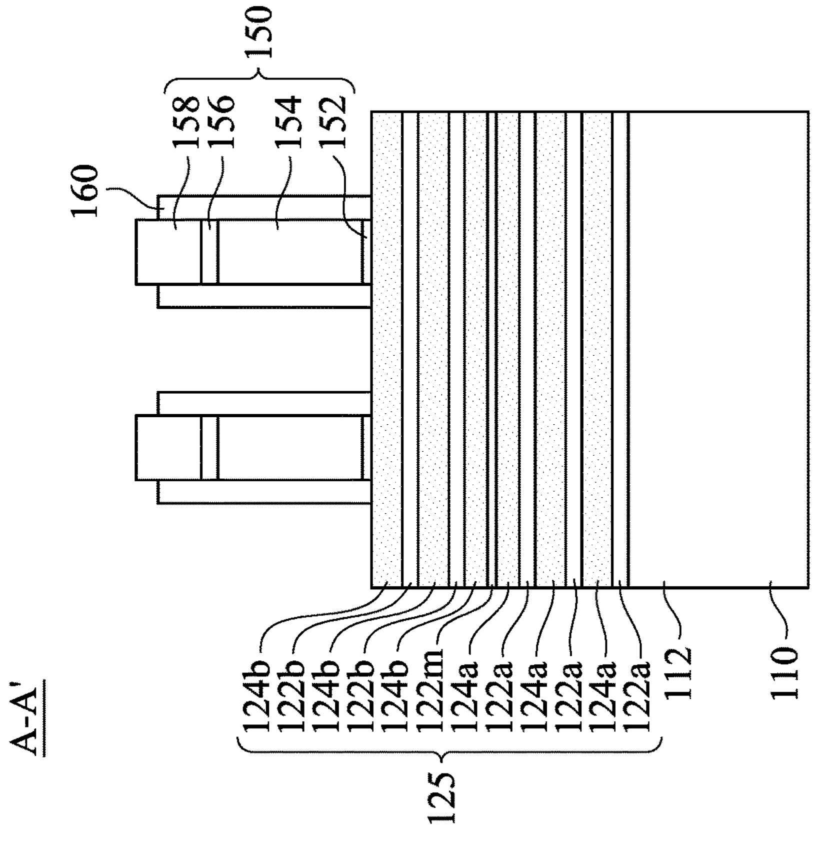
Figure 4C:
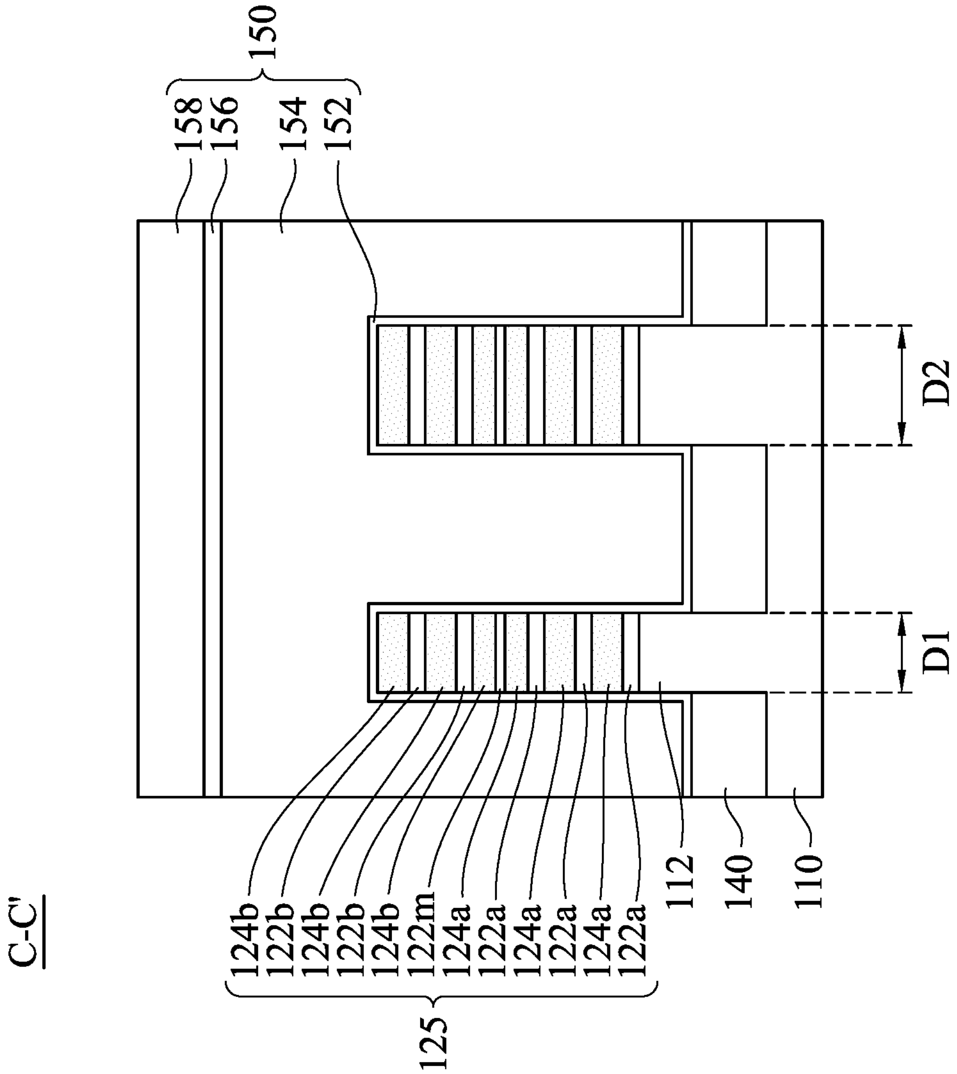

Reference is made to FIGS. 4A-4C. At least one dummy gate structure 150 is formed over the substrate 110 and is partially disposed over the fin structure 125. The portion of the fin structure 125 underlying the dummy gate structure 150 may be referred to as the channel region. The dummy gate structure 150 may also define source/drain regions S/D (labeled in FIG. 5A) of the fin structure 125, for example, the regions of the fin structure 125 adjacent and on opposing sides of the channel region.

Dummy gate formation operation forms a dummy gate dielectric layer, a dummy gate electrode layer and a hard mask which may include multiple layers (e.g., an oxide layer and a nitride layer) over the dummy gate electrode layer. The hard mask is then patterned, followed by patterning the dummy gate electrode layer by using the patterned hard mask as an etch mask. The etch process may include a wet etch, a dry etch, and/or combinations thereof. As such, a dummy gate structure 150 including a dummy gate dielectric layer 152, a dummy gate electrode layer 154 and a hard mask (e.g., an oxide layer 156 and a nitride layer 158) is formed. In some embodiments, the dummy gate structure 150 can be interchangeably referred to a dummy gate, a dummy gate pattern, a dummy gate strip, an isolation structure, or a dielectric gate.

In some embodiments, the dummy gate dielectric layer 152 may be made of a dielectric material such as silicon nitride (SiN), silicon oxide ($SiO_2$), silicon carbo-nitride (SiCN), silicon oxynitride (SiON), silicon oxy-carbo-nitride (SiOCN), or the like, and may have a single-layer structure or a multi-layer structure including a plurality of dielectric layers. In some embodiments, the dummy gate dielectric layer 152 may be made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the dummy gate dielectric layer 152 is an oxide layer. The dummy gate dielectric layer 152 may be formed by a deposition processes, such as chemical vapor deposition (CVD), physical vapor deposition (PVD), atomic layer deposition (ALD), plasma enhanced CVD (PECVD) or other suitable techniques. In some embodiments, the dummy gate electrode layer 154 may include polycrystalline-silicon (poly-Si), poly-crystalline silicon-germanium (poly-SiGe), metallic nitrides, metallic silicides, metallic oxides, or metals. In some embodiments, the dummy gate electrode layer 154 includes a metal-containing material such as TiN, TaN, TaC, Co, Ru, Al, combinations thereof, or multi-layers thereof. The dummy gate electrode layer 154 may be deposited by CVD, physical vapor deposition (PVD), sputter deposition, or other techniques suitable for depositing conductive materials.

After formation of the dummy gate structure 150 is completed, gate spacers 160 (see FIG. 4A) and fin spacers 162 (see FIG. 4B) are formed on sidewalls of the dummy gate structure 150 as shown in FIG. 4A and on sidewalls of the fin structure 125 as shown in FIG. 4B. For example, a spacer material layer is deposited on the substrate 110. The spacer material layer may be a conformal layer that is subsequently etched back to form gate sidewall spacers. In the illustrated embodiment, a spacer material layer is disposed conformally on top and sidewalls of the dummy gate structure 150 and the fin structure 125. The spacer material layer may include a dielectric material such as silicon oxide, silicon nitride, silicon carbide, silicon oxynitride, SiCN films, silicon oxycarbide, SiOCN films, and/or combinations thereof. In some embodiments, the spacer material layer includes multiple layers, such as a first spacer layer and a second spacer layer formed over the first spacer layer. In some embodiments, a fin spacer 164 as shown in FIG. 4B may be form between the fin spacer 162 and the fin structure 125. By way of example, the spacer material layer may be formed by depositing a dielectric material over the dummy gate structure 150 and the fin structure 125 using suitable deposition processes. An anisotropic etching process is then performed on the deposited spacer material layer to expose portions of the fin structure 125 not covered by the dummy gate structure 150 (e.g., over the source/drain regions of the fin structure 125). Portions of the spacer material layer directly above the dummy gate structure 150 and the fin structure 125 may be completely removed by this anisotropic etching process. Portions of the spacer material layer on sidewalls of the dummy gate structure 150 and the fin structure 125 may remain, forming gate sidewall spacers, which are denoted as the gate spacers 160 and the fin spacers 162, for the sake of simplicity. In some embodiments, the dummy gate structure 150 can be interchangeably referred to a dummy gate, a dummy gate pattern, a dummy gate strip, an isolation structure, or a dielectric gate.

Figure 5B:
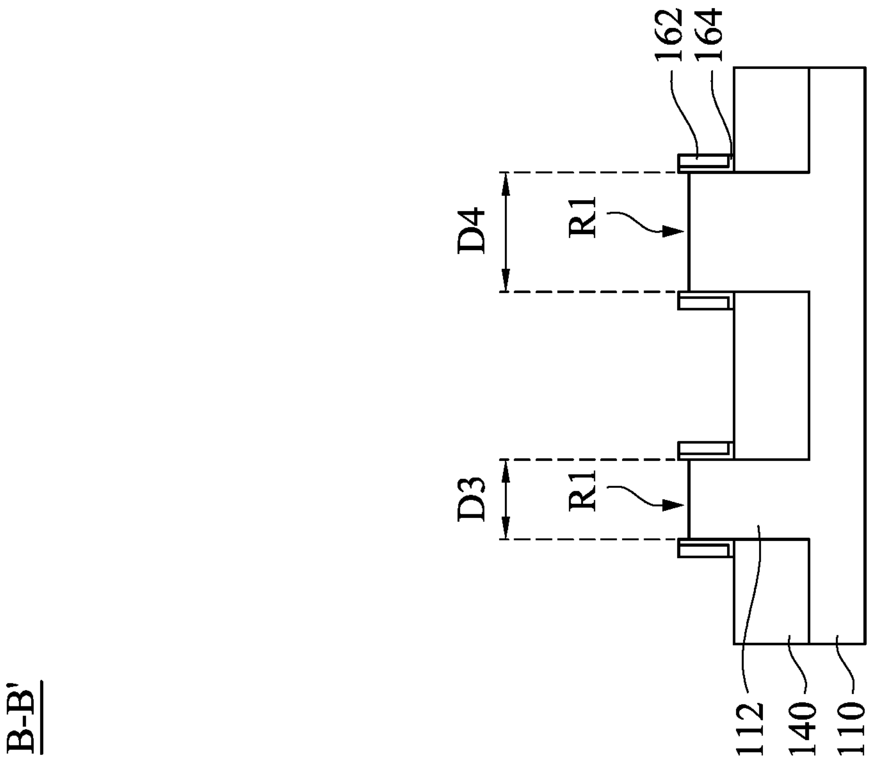
Figure 5A:
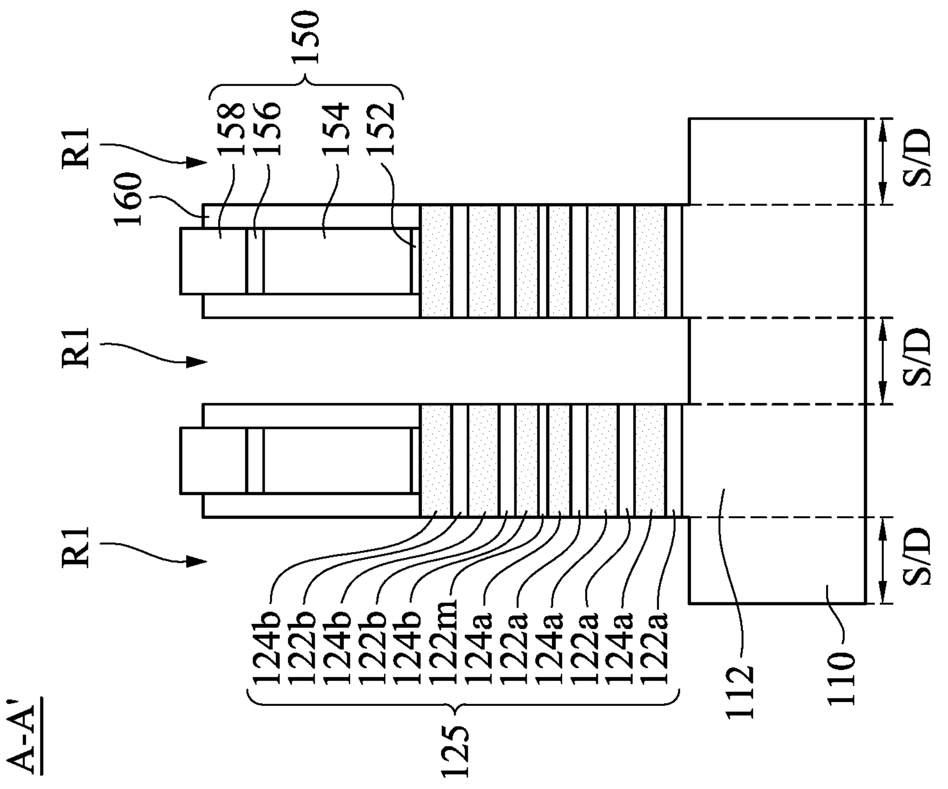
Figure 5C:
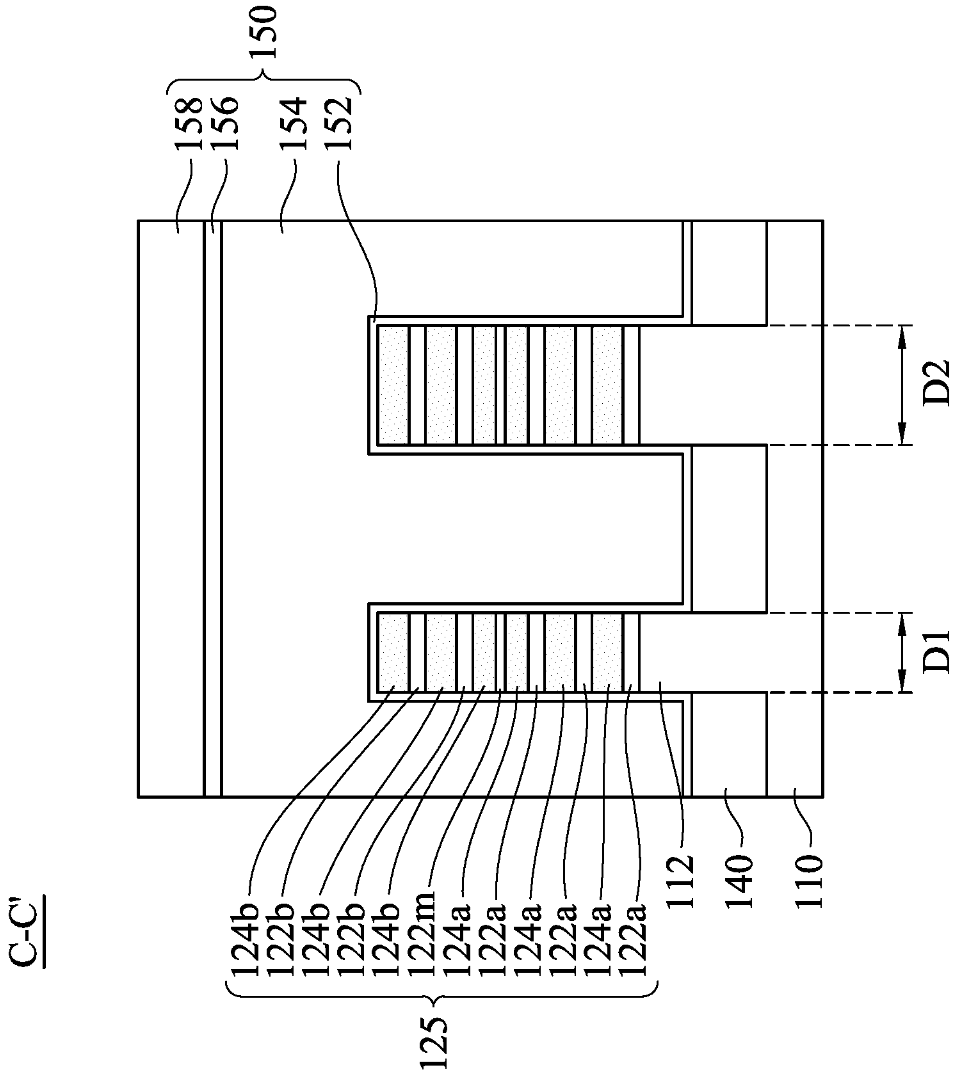

Reference is made to FIGS. 5A-5C. Exposed portions of the fin structure 125 that extend laterally beyond the gate spacers 160 (e.g., in source/drain regions S/D of the fin structure 125) are etched by using, for example, an anisotropic etching process that uses the dummy gate structure 150 and the gate spacers 160 as an etch mask, resulting in recesses R1 into the fin structure 125. After the anisotropic etching, end surfaces of the epitaxial layers 122*a*, 122*b*, 122*m*, and the epitaxial layers 124*a*, 124*b* and respective outermost sidewalls of the gate spacers 160 are substantially coterminous, due to the anisotropic etching. In some embodiments, the anisotropic etching may be performed by a dry chemical etch with a plasma source and a reaction gas. The plasma source may be an inductively coupled plasma (ICR) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

In some embodiments, the dimension D3 of the recess R1 where the pull-up/pull-down transistor formed subsequently thereon (e.g., transistor Tb1, Tt1, Tb3, and/or Tt3 as shown in FIG. 8A) is different than the dimension D4 of the recess R1 where the pass-gate transistor formed subsequently thereon (e.g., transistor Tb2, Tt2, Tb4, and/or Tt4 as shown in FIG. 8A). Specifically, the dimension D4 is greater than the dimension D3. In some embodiments, the dimension D4 is about 1.1 to about 2 (e.g. about 1.1, 1.2, 1.3, 1.4, 1.5, 1.6, 1.7, 1.8, 1.9, or 2) times the dimension D3.

Figure 6B:
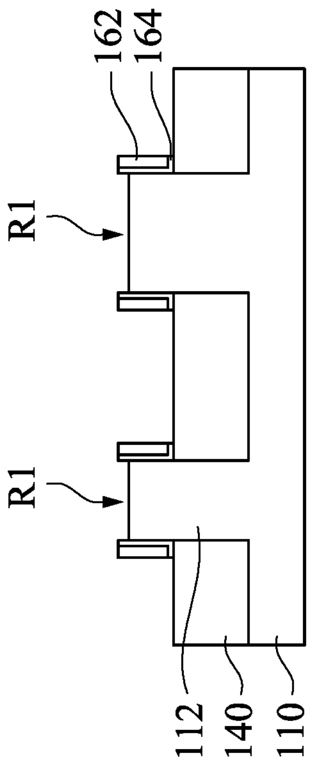
Figure 6A:
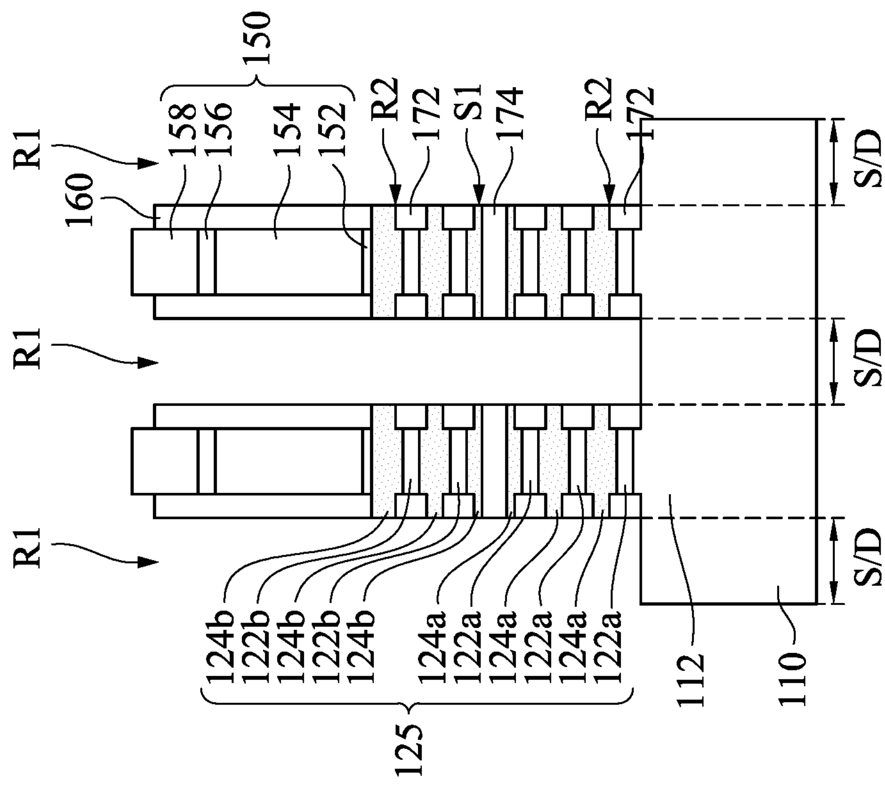
Figure 6C:
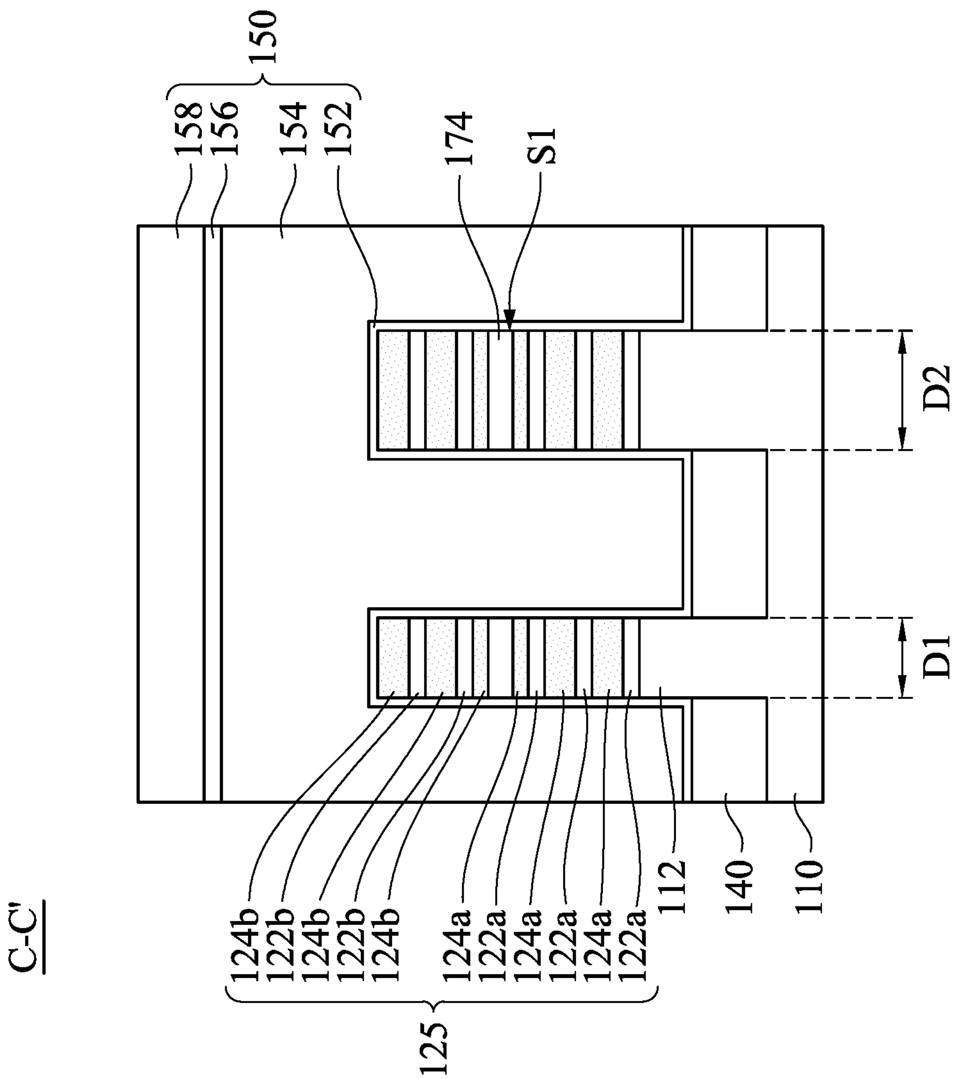

Reference is made to FIGS. 6A-6C. Epitaxial layers 122*a*, 122*b*, and 122*m* are laterally or horizontally recessed by using suitable etch techniques, resulting in lateral recesses R2 and a space S1 each vertically between corresponding epitaxial layers 124*a* and 124*b*. This operation may be performed by using a selective etching process. By way of example and not limitation, the epitaxial layers 122*a*, 122*b*, and 122*m* are SiGe and the epitaxial layers 124*a* and 124*b* are silicon allowing for the selective etching of the epitaxial layers 122*a*, 122*b*, and 122*m*. In some embodiments, the selective dry etching etches SiGe at a faster etch rate than it etches Si. As a result, the epitaxial layers 124*a* and 124*b* laterally extend past opposite end surfaces of the epitaxial layers 122*a*, 122*b*. In addition, since the epitaxial layer 122*m* (see FIGS. 5A and 5C) has a greater germanium atomic concentration than the epitaxial layers 122*a* and 122*b*, the selective dry etching etches the epitaxial layer 122*m* at a faster etch rate than it etches the epitaxial layers 122*a*, 122*b*, and thus the epitaxial layer 122*m* can be completely removed while the epitaxial layers 122*a*, 122*b* can be only partially removed.

Subsequently, inner dielectric spacers 172 and 174 are filled in the recesses R2 and the space S1, respectively. For example, spacer material layers are formed to fill the recesses R2 and the space S1 left by the lateral etching of the epitaxial layers 122*a*, 122*b*, and 122*m* discussed above. The spacer material layer may be a low-k dielectric material, such as $SiO_2$, SiN, SiC, SiON, SiCN, or SiOCN, and may be formed by a suitable deposition method, such as ALD. In some embodiments, the spacer material layer is intrinsic or un-doped with impurities. The spacer material layer can be formed using CVD, including LPCVD and PECVD, PVD, ALD, or other suitable processes. After the deposition of the spacer material layer, an anisotropic etching process may be performed to trim the deposited spacer material layer, such that portions of the deposited spacer material layer that fill the recesses R2 and the space S1 left by the lateral etching of the epitaxial layers 122*a*, 122*b*, and 122*m* are left. After the trimming process, the remaining portions of the deposited spacer material are denoted as inner dielectric spacers 172 in the recesses R2 and the inner dielectric spacers 174 in the recesses S1, for the sake of simplicity. The inner dielectric spacers 172 and 174 serve to isolate metal gates from source/drain epitaxial structures formed in subsequent processing.

Figure 7B:
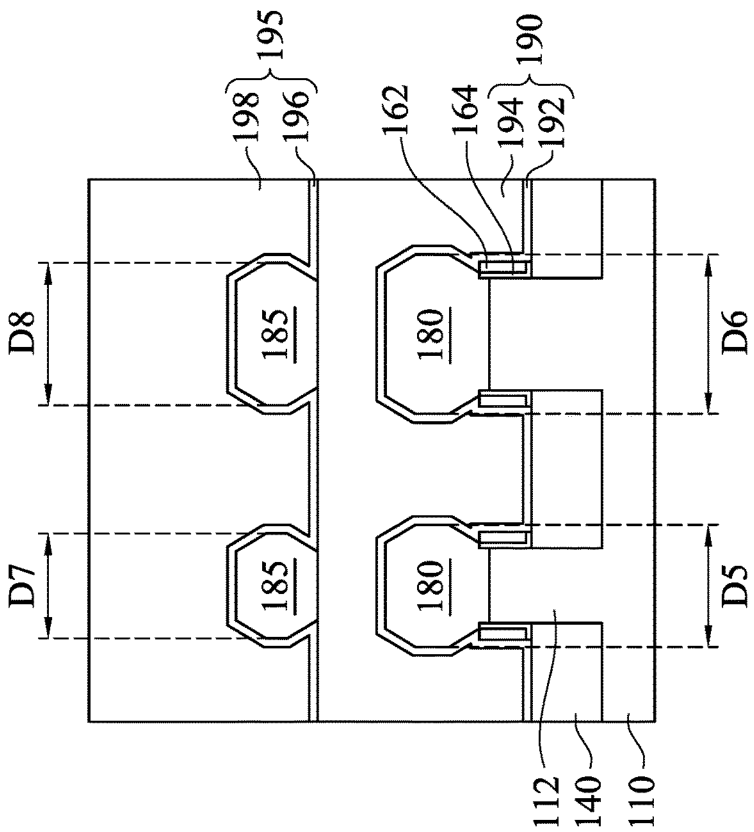
Figure 7A:
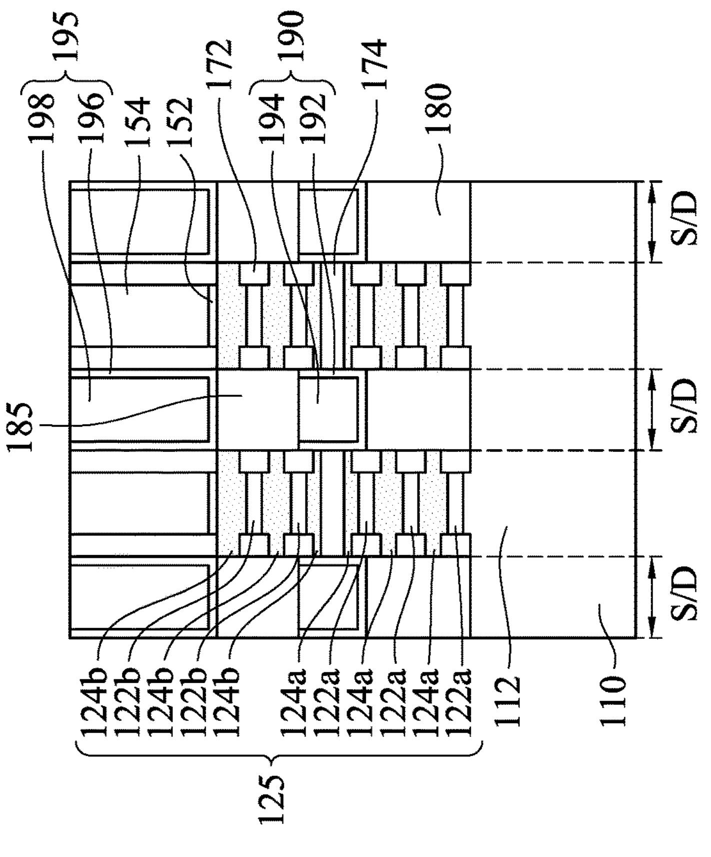
Figure 7C:
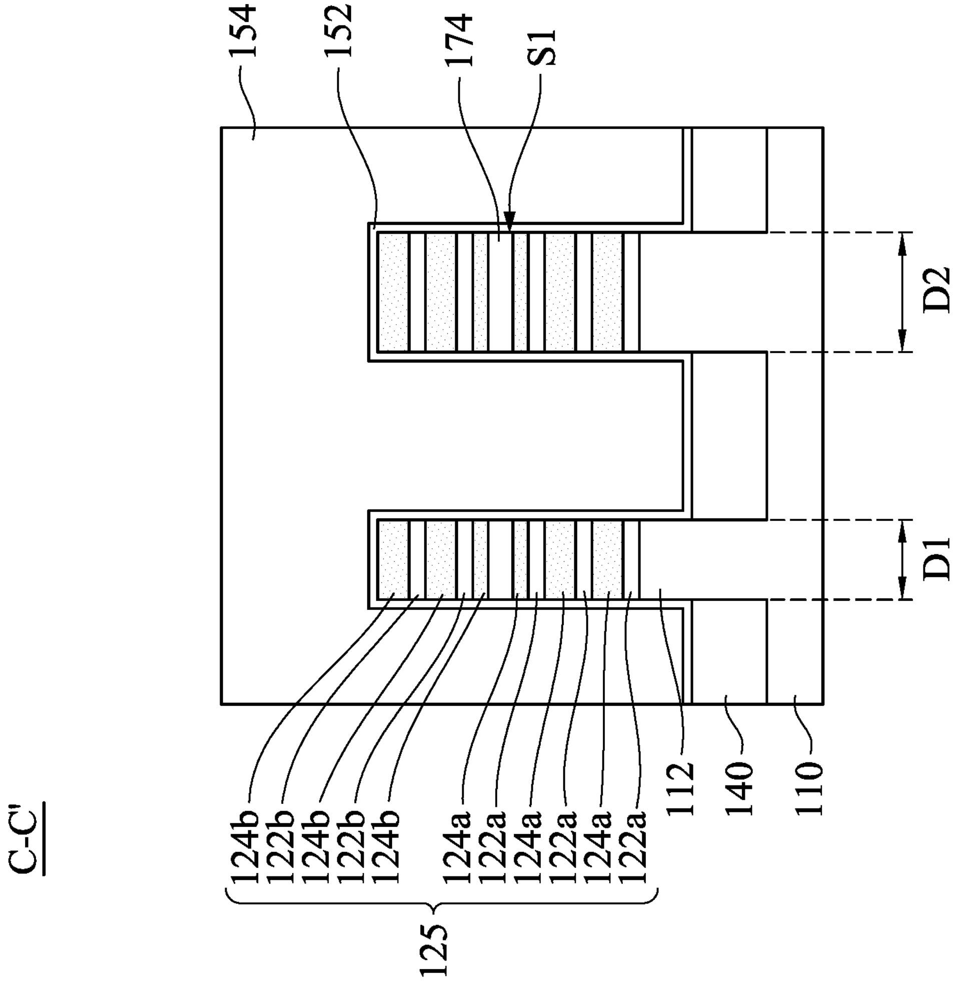

Reference is made to FIGS. 7A-7C. First source/drain epitaxial structures 180 can be formed on the protruding portions 112 and connected to the epitaxial layers 124*a*. In some embodiments, the first source/drain epitaxial structures 180 may include Ge, Si, GaAs, AlGaAs, SiGe, GaAsP, SiP, or other suitable material. The first source/drain epitaxial structures 180 may be doped by introducing doping species including: p-type dopants, such as boron or $BF_2$; n-type dopants, such as phosphorus or arsenic; and/or other suitable dopants including combinations thereof. In some exemplary embodiments, the first source/drain epitaxial structures 180 in a p-type include SiGeB and/or GeSnB. In some embodiments, the first source/drain epitaxial structure 180 can be interchangeably referred to as a source/drain pattern or an epitaxial pattern. In some embodiments, the dimension D5 of the first source/drain epitaxial structure 180 of the pull-up/pull-down transistor formed subsequently (e.g., transistor Tb1 and/or Tb3 as shown in FIG. 8A) is different than the dimension D6 of the first source/drain epitaxial structure 180 of the pass-gate transistor formed subsequently (e.g., transistor Tb2 and/or Tb4 as shown in FIG. 8A). Specifically, the dimension D6 is greater than the dimension D5. In some embodiments, the dimension D6 is about 1.1 to about 2 (e.g. about 1.1, 1.2, 1.3, 1.4, 1.5, 1.6, 1.7, 1.8, 1.9, or 2) times the dimension D5.

An interlayer dielectric (ILD) layer 194 is formed over the substrate 110. In some embodiments, a contact etch stop layer (CESL) 192 is also formed prior to forming the ILD layer 194. In some examples, the CESL 192 includes a silicon nitride layer, silicon oxide layer, a silicon oxynitride layer, and/or other suitable materials having a different etch selectivity than the ILD layer 194. In some embodiments, the CESL 192 and the ILD layer 194 can be collectively referred to as an isolation structure 190. In some embodiments, the ILD layer 194 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 192. Subsequently, the isolation structures 190 are recessed, such that the upper portions of the recesses R1 (see FIGS. 6A and 6B) may reappear.

Second source/drain epitaxial structures 185 are formed over the epitaxial isolation structure 190. In some embodiments, the second source/drain epitaxial structures 185 may include Ge, Si, GaAs, AlGaAs, SiGe, GaAsP, SiP, or other suitable material. The second source/drain epitaxial structures 185 may be doped by introducing doping species including: p-type dopants, such as boron or $BF_2$; n-type dopants, such as phosphorus or arsenic; and/or other suitable dopants including combinations thereof. In some exemplary embodiments, the second source/drain epitaxial structures 185 in an n-type transistor include SiP. The first source/drain epitaxial structures 180 and the second source/drain epitaxial structures 185 are made of different materials. For example, the first source/drain epitaxial structures 180 are made of SiGeB and the second source/drain epitaxial structures 185 are made of SiP. In some embodiments, the second source/drain epitaxial structure 185 can be interchangeably referred to as a source/drain pattern or an epitaxial pattern. Each of the epitaxial isolation stacks 190 is between one of the first source/drain epitaxial structures 180 and one of the second source/drain epitaxial structures 185 to electrically isolate the first source/drain epitaxial structure 180 from the second source/drain epitaxial structure 185. In some embodiments, the dimension D7 of the second source/drain epitaxial structure 185 of the pull-up/pull-down transistor formed subsequently (e.g., transistor Tt1, and/or Tt3 as shown in FIG. 8A) is different than the dimension D8 of the second source/drain epitaxial structure 185 of the pass-gate transistor formed subsequently (e.g., transistor Tt2 and/or Tt4 as shown in FIG. 8A). Specifically, the dimension D8 is greater than the dimension D7. In some embodiments, the dimension D8 is about 1.1 to about 2 (e.g. about 1.1, 1.2, 1.3, 1.4, 1.5, 1.6, 1.7, 1.8, 1.9, or 2) times the dimension D7.

An ILD layer 198 is formed over the substrate 110. In some embodiments, a CESL 196 is also formed prior to forming the ILD layer 198. In some examples, the CESL 196 includes a silicon nitride layer, silicon oxide layer, a silicon oxynitride layer, and/or other suitable materials having a different etch selectivity than the ILD layer 198. In some embodiments, the CESL 196 and the ILD layer 198 can be collectively referred to as an isolation structure 195. In some embodiments, the ILD layer 198 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL. After depositing the CESL 196 and the ILD layer 198, a planarization process (e.g., CMP process) may be performed to remove excessive materials of the CESL 196 and the ILD layer 198 overlying the dummy gate structures 150 and further remove hard mask layers 156 and 158 (as shown in FIG. 6A), such that the dummy gate electrode layer 154 is exposed.

Figure 8C:
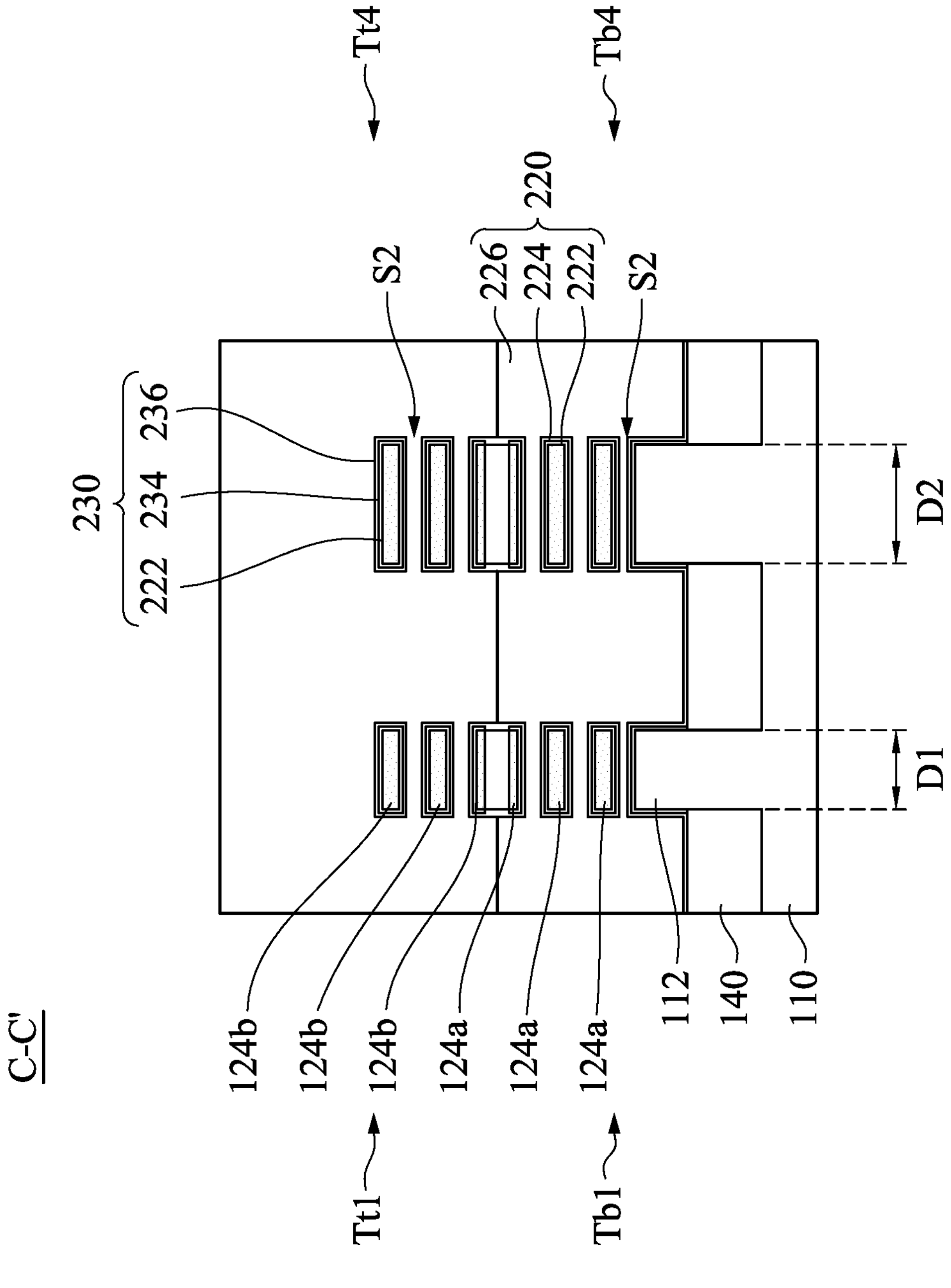

Reference is made to FIGS. 8A-8C. The dummy gate dielectric layer 152 and/or the dummy gate electrode layer 154 as shown in FIGS. 7A and 7C is removed, thus resulting in a gate trench GT between the gate spacers 160, with the epitaxial layers 122*a* and 122*b* exposed in the gate trench GT. Subsequently, the epitaxial layers 122*a* and 122*b* in the gate trench GT are removed, thus forming spaces S2 between neighboring epitaxial layers (i.e., channel layers) 124*a* and 124*b*. In some embodiments, the epitaxial layers 124*a* and 124*b* can be interchangeably referred to as nanostructure (nanowires, nanoslabs and nanorings, nanosheet, etc., depending on their geometry).

A (metal) gate structure 220 is formed in the gate trench GT and the spaces S2 to surround each of the epitaxial layers 124*a* and 124*b* suspended in the gate trench GT and the spaces S2. In various embodiments, the gate structure 220 includes an interfacial layer 222 formed around the epitaxial layers 124*a* and 124*b*, a high-k gate dielectric layer 224 formed over the interfacial layer 222, and a gate electrode layer 226 formed over the high-k gate dielectric layer 224 and filling a remainder of gate trench GT. In some embodiments, the interfacial layer 222 may include a dielectric material such as silicon oxide ($SiO_2$), HfSiO, or silicon oxynitride (SiON). The high-k gate dielectric layer 224 may include dielectric materials having a high dielectric constant (high-k), for example, greater than that of thermal silicon oxide (~3.9). For example, the high-k dielectric layer 224 may include hafnium oxide ($HfO_2$). The gate electrode layer 226 may include a work function metal layer and/or a fill metal formed around the work function metal layer. For an n-type FinFET, the work function metal layer may include one or more n-type work function metals. On the other hand, for a p-type FinFET, the work function metal layer may include one or more p-type work function metals. In some embodiments, the fill metal may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials. After the formation of the gate structure 220, the fill metal is etched back by using an etching process, and top portions of the work function metal layer are exposed. Next, the top portions of the work function metal layer are removed by using an etching process, such that the upper portions of the gate trenches GT may reappear. In some embodiments, the gate structure 220 can be interchangeably referred to a metal gate, a gate pattern, or a gate strip.

A gate electrode layer 236 is deposited in the gate trench GT and over the gate electrode layer 226. Therefore, a gate structure 230 including the interfacial layer 222, the high-k dielectric layer 224, the gate electrode layer 236 is formed within the remainder of the spaces S2. As such, the semiconductor structure 100*a* is formed. In some embodiments, the gate structure 230 can be interchangeably referred to a metal gate, a gate pattern, or a gate strip. In some embodiments, the gate electrode layer 236 may include a work function metal layer and/or a fill metal formed around the work function metal layer. For an n-type FinFET, the work function metal layer may include one or more n-type work function metals. On the other hand, for a p-type FinFET, the work function metal layer may include one or more p-type work function metals. In some embodiments, the fill metal may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

The semiconductor structure 100*a* includes a bottom-tier transistor Tb1, a top-tier transistor Tt1, a bottom-tier transistor Tb2, a top-tier transistor Tt2, a bottom-tier transistor Tb3 (see FIG. 2A), a top-tier transistor Tt3 (see FIG. 2A), a bottom-tier transistor Tb4, and a top-tier transistor Tt4. The top-tier transistor Tt1 is over the bottom-tier transistor Tb1, the top-tier transistor Tt2 is over the bottom-tier transistor Tb2, the top-tier transistor Tt3 is over the bottom-tier transistor Tb3, and the top-tier transistor Tt4 is over the bottom-tier transistor Tb4. The bottom-tier transistors Tb1, Tb2, Tb3, and Tb4 each includes the channel layers 124*a*, the first source/drain epitaxial structures 180 on opposite sides of the channel layers 124*a* and connected to the channel layers 124*a*, and the gate structure 220 wrapping around the channel layers 124*a*. The top-tier transistors Tt1, Tt2, Tt3, and Tt4 each includes the channel layers 124*b*, the second source/drain epitaxial structures 185 on opposite sides of the channel layers 124*b* and connected to the channel layers 124*b*, and a (metal) gate structure 230 wrapping around the channel layers 124*b*. In some embodiments, the bottom-tier transistors Tb1, Tb2, Tb3, and Tb4 are p-type transistors, and the top-tier transistors Tt1, Tt2, Tt3, and Tt4 are n-type transistors. In some other embodiments, the bottom-tier transistors Tb1, Tb2, Tb3, and Tb4 are n-type transistors, and the top-tier transistors Tt1, Tt2, Tt3, and Tt4 are p-type transistors.

Figure 9B:
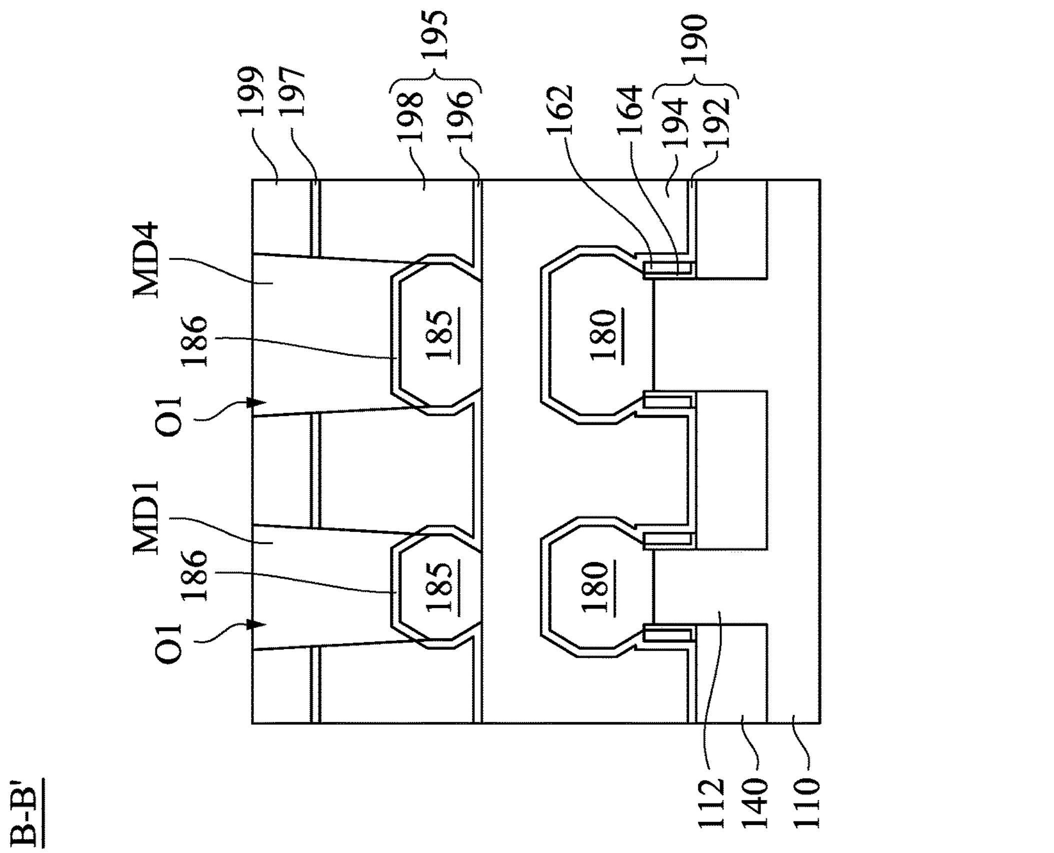
Figure 9A:
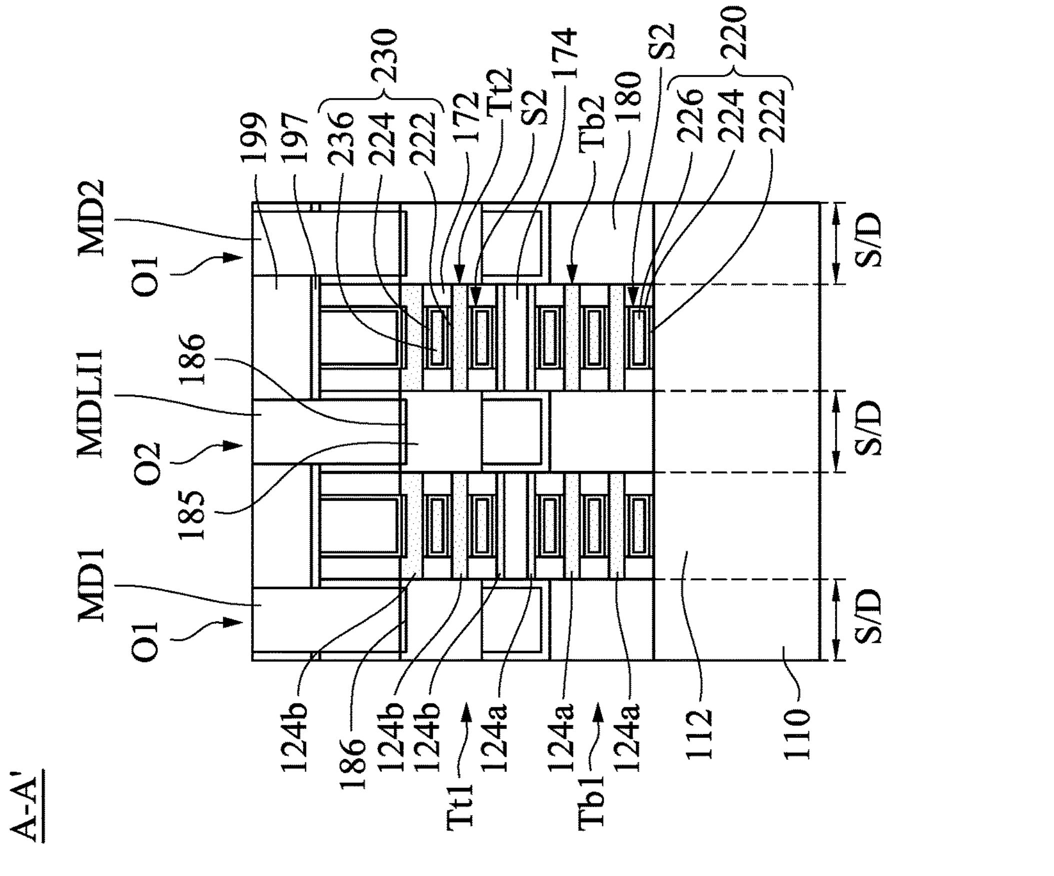
Figure 10B:
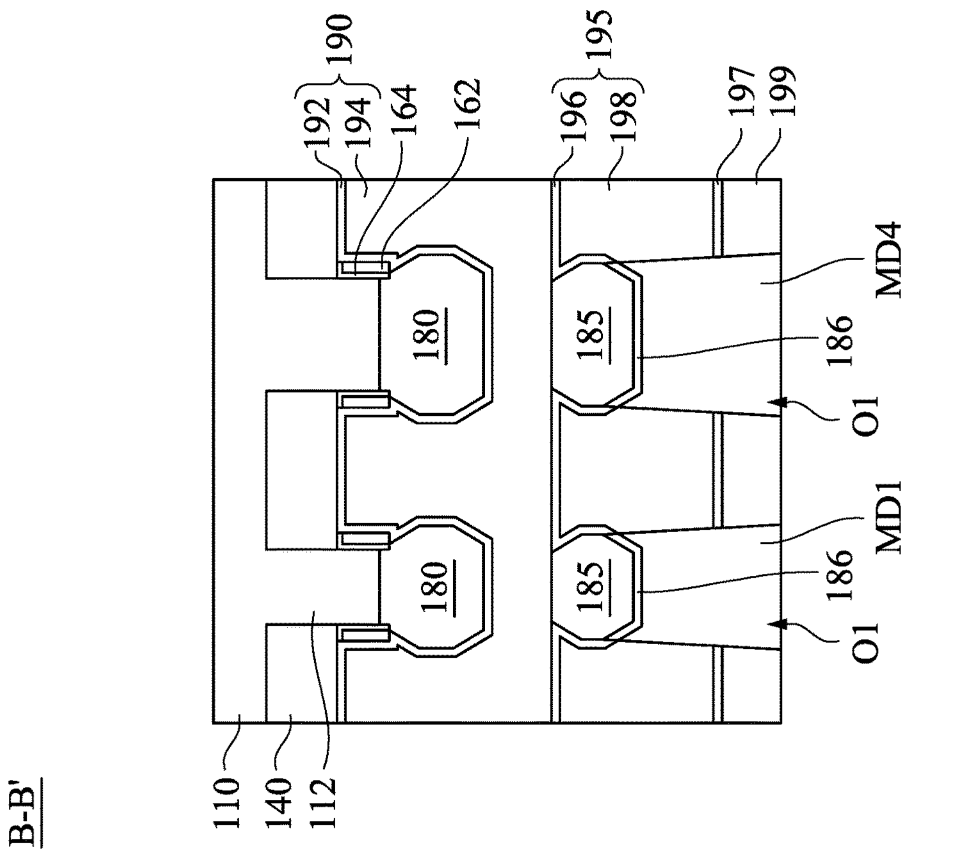
Figure 10A:
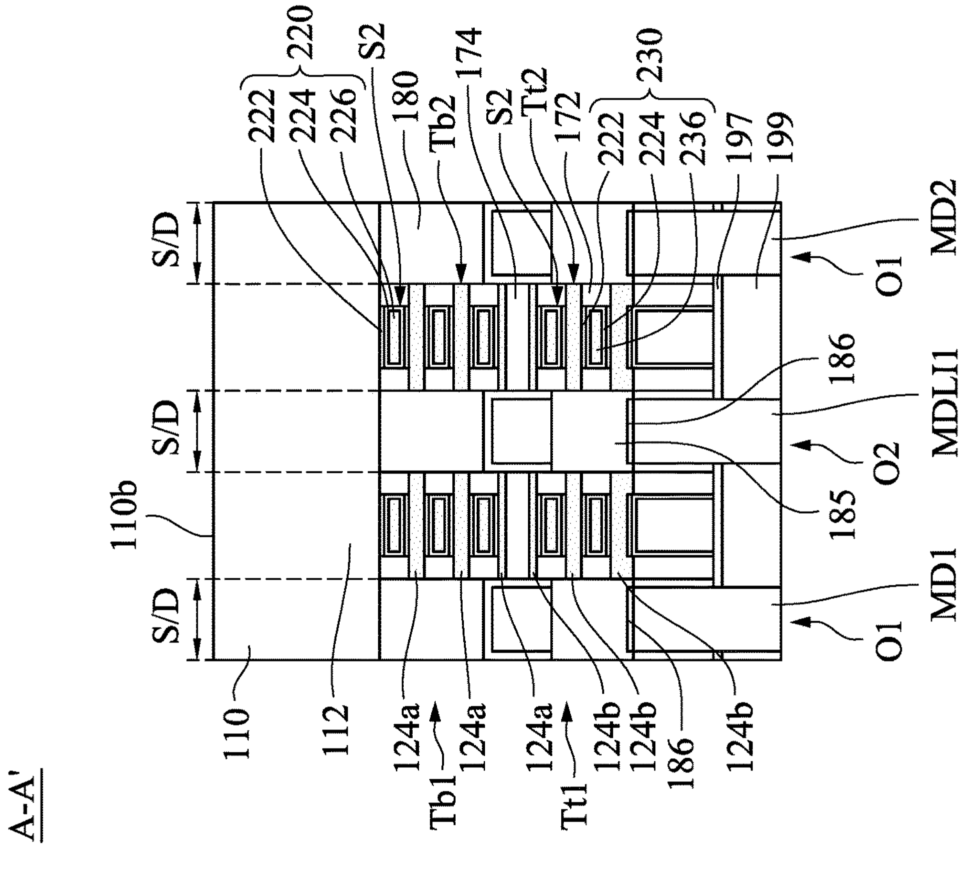
Figure 11A:
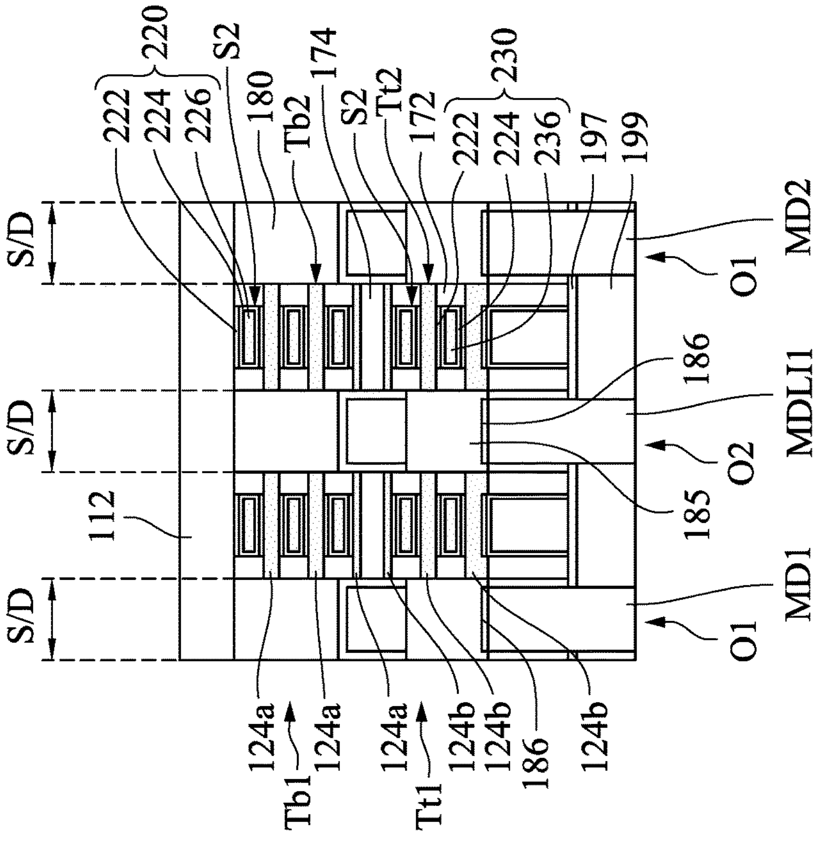
Figure 11B:
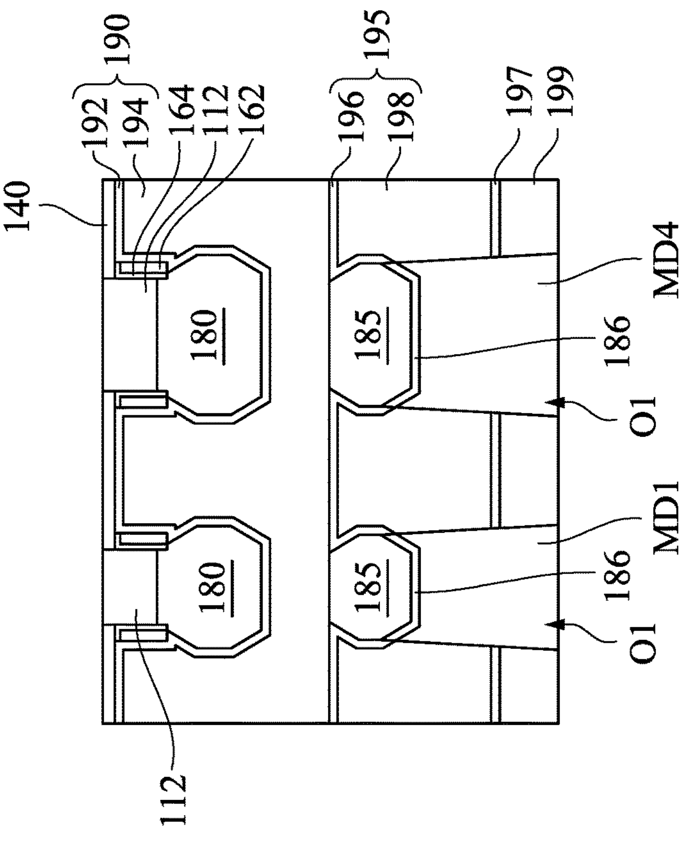

Reference is made to FIGS. 9A and 9B. Openings O1 where the source/drain contacts MD1, MD2, and MD4 will be subsequently formed therein are formed to extend through the ILD layer 198, the CESL 196 and expose corresponding first ones of the first source/drain epitaxial structures 180, and a source/drain contact opening O2 where the vertical local interconnect MDLI1 (see FIG. 9A) will be subsequently formed therein is formed to extend through the ILD layer 198, the CESL 196 and at least expose a corresponding second one of the first source/drain epitaxial structures 180. In some embodiments, the forming of the openings O1 and O2 can be performed by an etching process being an anisotropic dry etching process (e.g., a reactive-ion etching (RIE) process or an atomic layer etching (ALE) process). Before the source/drain contacts MD1, MD2, and MD4 and the vertical local interconnect MDLI1 are formed, metal silicide layers 186 may be selectively formed on the first source/drain epitaxial structures 180 through the openings O1 and O2 by a metal silicidation process. The metal silicidation process is to make a reaction between metal and silicon (or polycrystalline silicon). In some embodiments, the metal silicide layer 186 may be made of n-silicide. In some embodiments, the metal silicide layer 186 may include titanium silicide (TiSi), nickel silicide (NiSi), cobalt silicide (CoSi), Ni—Pt, or combinations thereof.

Subsequently, the source/drain contacts MD1, MD2, and MD4 and the vertical local interconnect MDLI1 are formed in remainders of the openings O1 and O2 and on the metal silicide layers 186. In greater detail, a conductive material may be formed by using a metallization process to fill the openings O1 and O2. Subsequently, the excess portions of the conductive material are removed, either through etching, chemical mechanical polishing (CMP), or the like, forming the upper surface of the metal-filled opening substantially coplanar with a top surface of the ILD layer 198. The remaining portions of the conductive material in the openings O1 and O2 form the source/drain contacts MD1, MD2, and MD4 and the vertical local interconnect MDLI1. The conductive material may include a low resistivity conductor material selected from the group of conductor materials including, but not limited to, tungsten and tungsten-based alloy. Alternatively, the conductive material may include various materials, such as cobalt, copper, ruthenium, aluminum, gold, silver, another suitable conductive material, or combinations thereof. In some embodiments, the vertical local interconnect MDLI1 has been created to establish a connection between the source/drain regions of both the top and bottom-tier transistors in the vertical direction. In other cross-sectional views that are not currently displayed, it is evident that this vertical local interconnect structure links the source/drain region of the top-tier transistor with the corresponding region of the bottom-tier transistor.

In some embodiments, front-side source/drain vias (e.g., front-side source/drain vias VD1, VD2, and VD4 as shown in FIG. 2A) can be formed over the front-side source/drain contacts MD1, MD2, and MD4. Subsequently, a first one of the front-side metal lines (e.g., the front-side metal line VSS1 as shown in FIG. 2A) can be formed on one of the source/drain vias (e.g., the source/drain via VD1 as shown in FIG. 2A), and a second one of the front-side metal lines (e.g., the front-side metal line BL as shown in FIG. 2A) can be formed over another one of the source/drain vias (e.g., the source/drain via VD2 as shown in FIG. 2A). In some embodiments, a front-side gate via (e.g., the front-side gate via VG1 as shown in FIG. 2A) can be formed over a front-side of the gate structure 230. Subsequently, a third one of the front-side metal lines (e.g., the front-side metal line WL1 as shown in FIG. 2A) can be formed on the front-side gate via. In some embodiments, a butted contact (e.g., the butted contact BCT1 as shown in FIG. 2A) can be formed to connect the vertical local interconnect MDLI1 to the gate structure 230.

Reference is made to FIGS. 10A-11B. The structures of FIGS. 9A and 9B are "flipped" upside down (see FIGS. 10A and 10B), and the substrate 110 can be thinned from the back-side 110*b* thereof. The substrate 110 can be thinned in a plurality of process operations, for example, CMP, HNA, and/or TMAH etching from the back-side 110*b* of the substrate 110.

Figure 12B:
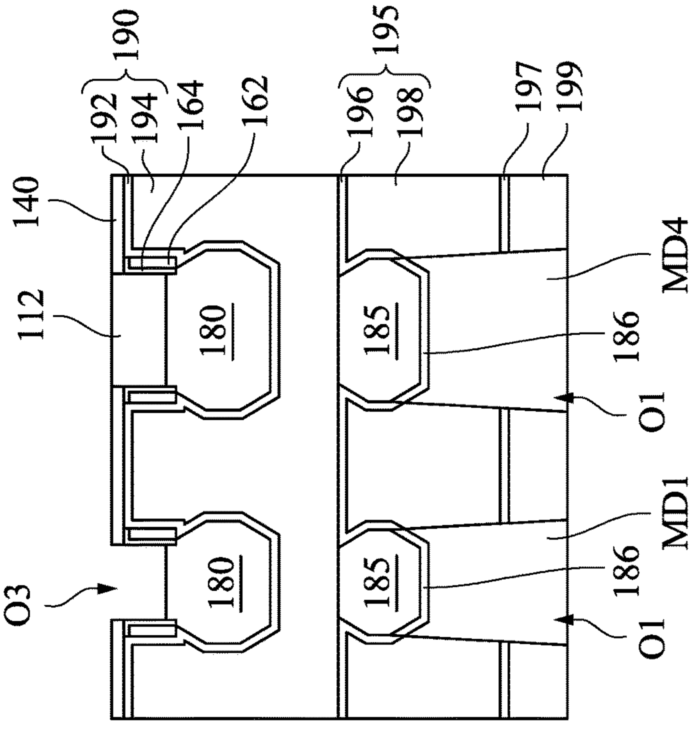
Figure 12A:
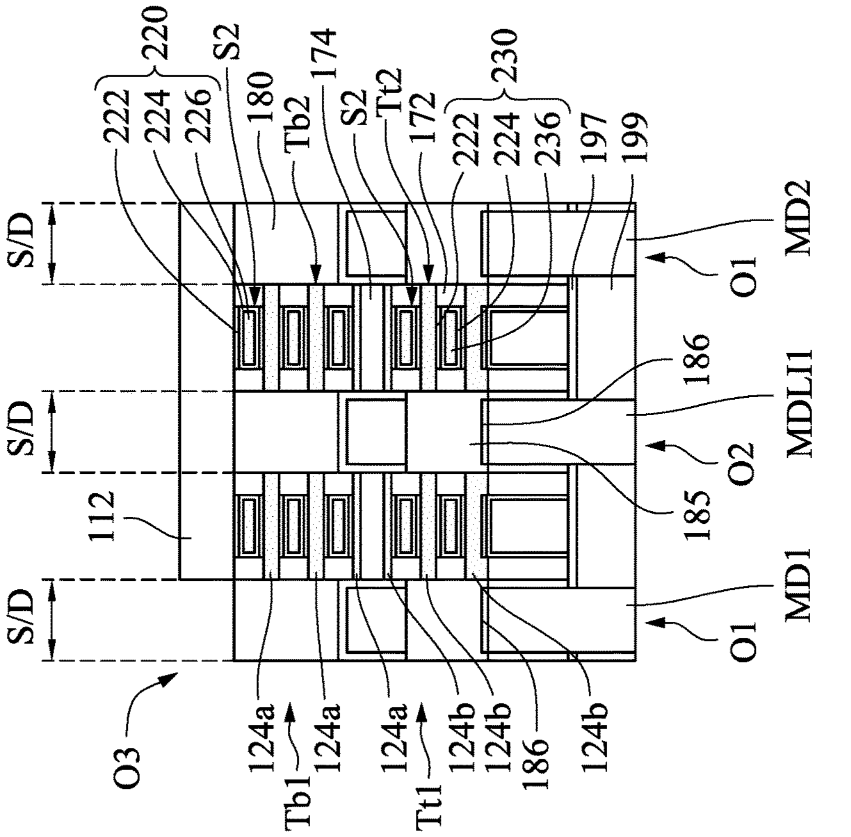

Reference is made to FIGS. 12A and 12B. An etching process can be performed to remove the protruding portion 112 on the first source/drain epitaxial structure 180 to form an opening O3, in which the first source/drain epitaxial structure 180 can act as an etch stop layer. In some embodiments, the etching process may be an anisotropic dry etch process, such as a dry etch process (e.g., RIE, a NBE, or the like) and may employ a different etchant than that used in the etching process.

Figure 13B:
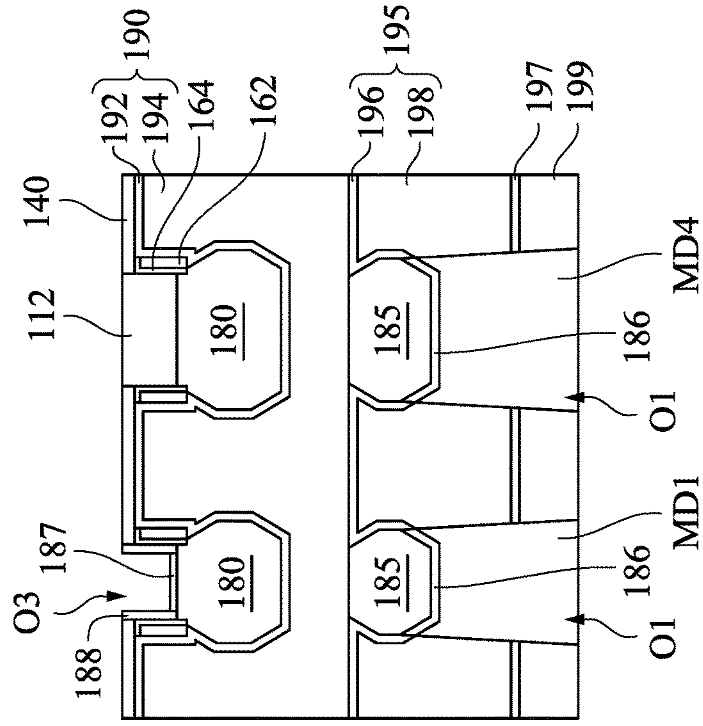
Figure 13A:
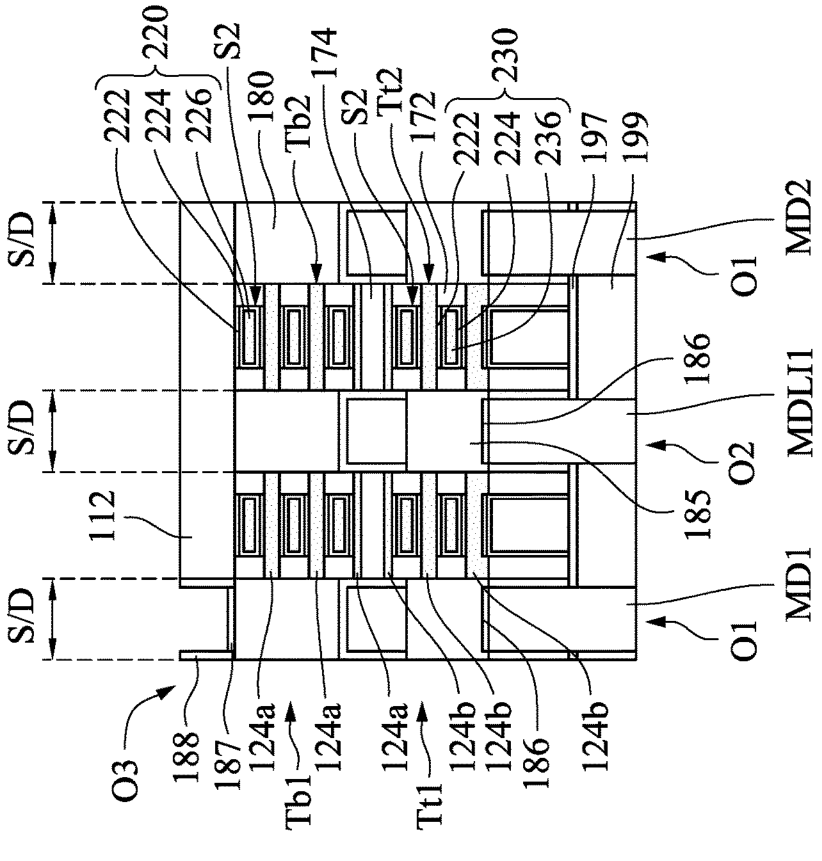

Reference is made to FIGS. 13A and 13B. Before the source/drain contact BMD1 (see FIGS. 14A and 14B) is formed, a spacer 188 may be formed on a sidewall of the opening O3, and a metal silicide layer 187 may be selectively formed on the first source/drain epitaxial structures 180 through the opening O3 by a metal silicidation process. In some embodiments, the spacer 188 can be made of a dielectric material, such as silicon nitride (SiN), silicon oxide ($SiO_2$), silicon carbo-nitride (SiCN), silicon oxynitride (SiON), silicon oxy-carbo-nitride (SiOCN), or the like. The metal silicidation process is to make a reaction between metal and silicon (or polycrystalline silicon). In some embodiments, the metal silicide layer 187 may include titanium silicide (TiSi), nickel silicide (NiSi), cobalt silicide (CoSi), Ni—Pt, or combinations thereof.

Figure 14B:
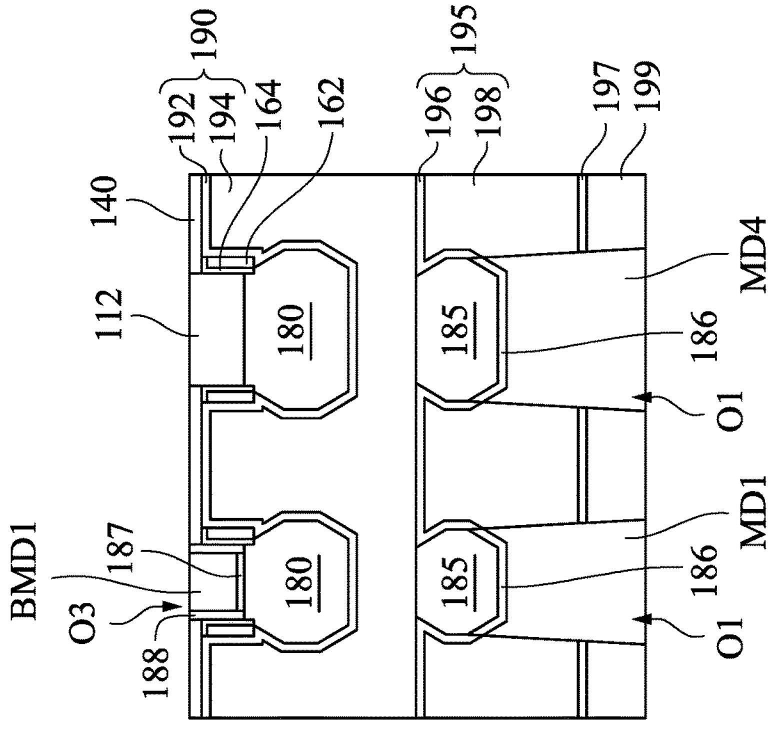
Figure 14A:
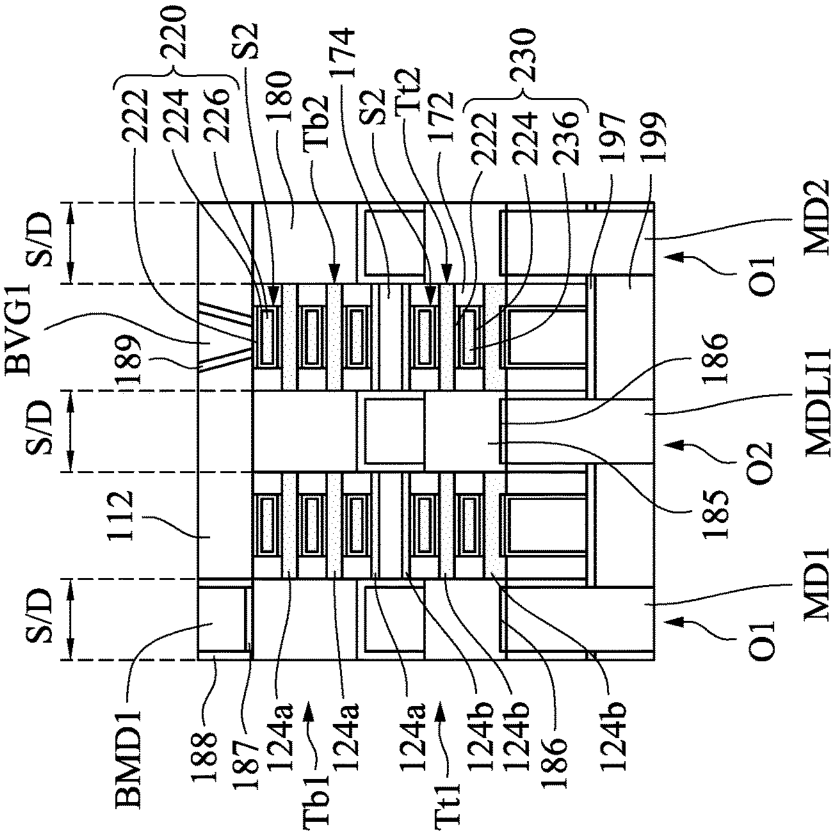

Reference is made to FIGS. 14A and 14B. The back-side source/drain contact BMD1 can be formed in a remainder of the opening O3 and on the metal silicide layer 187. In greater detail, a conductive material may be formed by using a metallization process to fill the opening O3. Subsequently, the excess portions of the conductive material are removed, either through etching, chemical mechanical polishing (CMP), or the like, forming the upper surface of the metal-filled opening substantially coplanar with a top surface of the isolation structure 140. The remaining portion of the conductive material in the opening O3 forms the back-side source/drain contact BMD1. The conductive material may include a low resistivity conductor material selected from the group of conductor materials including, but not limited to, tungsten and tungsten-based alloy. Alternatively, the conductive material may include various materials, such as cobalt, copper, ruthenium, aluminum, gold, silver, another suitable conductive material, or combinations thereof. In some embodiments, a back-side source/drain via (e.g., back-side source/drain via BVD1 as shown in FIG. 2A) can be formed over the back-side source/drain contact BMD1. Subsequently, a back-side metal line (e.g., back-side metal line VDD as shown in FIG. 2A) can be formed on the back-side source/drain via. In some embodiments, the back-side gate via BVG1 can be formed on the back-side of the gate structures 220 of the transistor Tb2, and a spacer 189 may be formed to laterally surround the spacer 189. In some embodiments, the spacer 189 can be made of a dielectric material, such as silicon nitride (SiN), silicon oxide ($SiO_2$), silicon carbo-nitride (SiCN), silicon oxynitride (SiON), silicon oxy-carbo-nitride (SiOCN), or the like.

Therefore, based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides a memory cell comprising a pass-gate transistor that can have a greater channel width (referred to as an oxide definition (OD) jog) compared to the pull-up/pull-down transistor. This feature can improve Vt tuning and mobility tuning on the memory cell, resulting in more efficient memory operations. This technique can also be applied to other SRAM cell types, such as PMOS pass gate or multi-port SRAM.

In some embodiments, a method includes forming a first bottom-tier transistor; forming a second bottom-tier transistor, the first and second bottom-tier transistors sharing a same source/drain region; forming a first top-tier transistor over the first bottom-tier transistor, the first top-tier transistor comprising a first channel layer and a first gate structure around the first channel layer; forming a second top-tier transistor over the second bottom-tier transistor, the second top-tier transistor comprising a second channel layer and a second gate structure around the second channel layer, the first and second top-tier transistors sharing a same source/drain region, wherein from a top view, a first dimension of the first channel layer in a lengthwise direction of the first gate structure is different than a second dimension of the second channel layer in the lengthwise direction of the first gate structure. In some embodiments, the first and second bottom-tier transistors and the first and second top-tier transistors are of a static random access memory cell. In some embodiments, the first top-tier transistor is a pull-down transistor or a pull-up transistor, and the second top-tier transistor is a pass-gate transistor. In some embodiments, the second dimension of the second channel layer of the second top-tier transistor is greater than the first dimension of the first channel layer of the first top-tier transistor. In some embodiments, the second dimension of the second channel layer of the second top-tier transistor is about 1.1 to about 2 times the first dimension of the first channel layer of the first top-tier transistor. In some embodiments, from the top view, the first channel layer of the first top-tier transistor has a first side extending along a first direction perpendicular to the lengthwise direction of the first gate structure, the second channel layer of the second top-tier transistor has a second side extending along the first direction, the first side is inward relative to the second side in the lengthwise direction of the first gate structure. In some embodiments, from the top view, the first channel layer of the first top-tier transistor has a third longest sides opposing the first side, the second channel layer of the second top-tier transistor has a fourth side opposing the second side, the third side is inward relative to the fourth side in the lengthwise direction of the first gate structure. In some embodiments, from the top view, the first channel layer of the first top-tier transistor has a third side opposing the first side, the second channel layer of the second top-tier transistor has a fourth side opposing the second side, the third side is aligned with the fourth side. In some embodiments, the first top-tier transistor comprises a first source/drain region at a side of the first gate structure opposing to the second gate structure, the method further comprising: forming a source/drain contact over the first source/drain region; forming a source/drain via over the source/drain contact, wherein from the top view, the first side is between the third side and the source/drain via. In some embodiments, the first top-tier transistor comprises a first source/drain region at a side of the first gate structure opposing the second gate structure, the method further comprising: forming a source/drain contact over the first source/drain region; forming a source/drain via over the source/drain contact, wherein from the top view, the third side is between the first side and the source/drain via.

In some embodiments, a method includes forming a first semiconductive nanostructure, a second semiconductive nanostructure vertically arranged with respect to the first semiconductive nanostructure, a third semiconductive nanostructure laterally adjacent to the first semiconductive nanostructure, and a fourth semiconductive nanostructure vertically arranged with respect to the third semiconductive nanostructure; forming a first epitaxial structure between the first and third semiconductive nanostructures, and a second epitaxial structure between the second and fourth semiconductive nanostructures; forming a first gate wrapping around the first semiconductive nanostructure, a second gate wrapping around the second semiconductive nanostructure, a third gate wrapping around the third semiconductive nanostructure, and a fourth gate wrapping around the fourth semiconductive nanostructure, wherein from a top view, a first dimension of the first semiconductive nanostructure in a lengthwise direction of the first gate is less than a second dimension of the third semiconductive nanostructure in the lengthwise direction of the first gate. In some embodiments, the first semiconductive nanostructure and the first gate are of a pull-down transistor, the second semiconductive nanostructure and the second gate are of a pull-up transistor, and the third semiconductive nanostructure and the third gate are of a pass-gate transistor. In some embodiments, from the top view, a third dimension of the second semiconductive nanostructure in the lengthwise direction of the first gate is less than the second dimension of the third semiconductive nanostructure. In some embodiments, the third dimension of the second semiconductive nanostructure is the same as the first dimension of the first semiconductive nanostructure. In some embodiments, from the top view, a third dimension of the fourth semiconductive nanostructure in the lengthwise direction of the first gate is greater than the first dimension of the first semiconductive nanostructure.

In some embodiments, a semiconductor structure includes a first transistor, a second transistor, a third transistor, and a fourth transistor. The first transistor is of a static random access memory (SRAM) cell. The first transistor includes first semiconductor sheets and a first gate structure surrounding each of the first semiconductor sheets. The second transistor is of the SRAM cell over the first transistor. The third transistor is of the SRAM cell laterally adjacent to the first transistor. The fourth transistor is of the SRAM cell over the third transistor. The fourth transistor includes second semiconductor sheets and a second gate structure surrounding each of the second semiconductor sheets. From a top view, a first dimension of one of the first semiconductor sheets in a lengthwise direction of the first gate structure is less than a second dimension of one of the second semiconductor sheets in the lengthwise direction of the first gate structure. In some embodiments, from the top view, the one of the first semiconductor sheets has a first side extending along a first direction perpendicular to the lengthwise direction of the first gate structure, the one of the second semiconductor sheets has a second side extending along the first direction, the first side is inward relative to the second side in the lengthwise direction of the first gate structure. In some embodiments, from the top view, the one of the first semiconductor sheets has a third side opposing the first side, the one of the second semiconductor sheets has a fourth side opposing the second side, the third side is inward relative to the fourth side in the lengthwise direction of the first gate structure. In some embodiments, the first transistor is a pull-down transistor or a pull-up transistor. In some embodiments, the fourth transistor is a pass-gate transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a first bottom-tier transistor;

forming a second bottom-tier transistor, the first and second bottom-tier transistors sharing a first same source/drain region;

forming a first top-tier transistor over the first bottom-tier transistor, the first top-tier transistor comprising a first channel layer and a first gate structure around the first channel layer; and forming a second top-tier transistor over the second bottom-tier transistor, the second top-tier transistor comprising a second channel layer and a second gate structure around the second channel layer, the first and second top-tier transistors sharing a second same source/drain region, wherein the first top-tier transistor is a pull-down transistor and the second top-tier transistor is a pass-gate transistor, and wherein from a top view, a first dimension of the first channel layer in a lengthwise direction of the first gate structure is less than a second dimension of the second channel layer in the lengthwise direction of the first gate structure.

2. The method of claim 1, wherein the first and second bottom-tier transistors and the first and second top-tier transistors are of a static random access memory cell.

3. The method of claim 1, wherein the second dimension of the second channel layer of the second top-tier transistor is about 1.1 to about 2 times the first dimension of the first channel layer of the first top-tier transistor.

4. The method of claim 1, wherein from the top view, the first channel layer of the first top-tier transistor has a first side extending along a first direction perpendicular to the lengthwise direction of the first gate structure, the second channel layer of the second top-tier transistor has a second side extending along the first direction, the first side is inward relative to the second side in the lengthwise direction of the first gate structure.

5. The method of claim 4, wherein from the top view, the first channel layer of the first top-tier transistor has a third side opposing the first side, the second channel layer of the second top-tier transistor has a fourth side opposing the second side, the third side is aligned with the fourth side.

6. The method of claim 5, wherein the first top-tier transistor comprises a first source/drain region at a side of the first gate structure opposing to the second gate structure, the method further comprising:

forming a source/drain contact over the first source/drain region; and forming a source/drain via over the source/drain contact, wherein from the top view, the first side is between the third side and the source/drain via.

7. The method of claim 5, wherein the first top-tier transistor comprises a first source/drain region at a side of the first gate structure opposing the second gate structure, the method further comprising:

forming a source/drain contact over the first source/drain region; and forming a source/drain via over the source/drain contact, wherein from the top view, the third side is between the first side and the source/drain via.

8. The method of claim 1, further comprising:

forming a first source/drain epitaxial structure connected to the first channel layer of the first top-tier transistor; and forming a second source/drain epitaxial structure connected to the second channel layer of the second top-tier transistor, wherein, from the top view, a dimension of the second source/drain epitaxial structure is greater than a dimension of the first source/drain epitaxial structure in the lengthwise direction of the first gate structure.

9. A semiconductor structure, comprising:

a first transistor of a static random access memory (SRAM) cell, the first transistor comprising:

first semiconductor sheets; and a first gate structure surrounding each of the first semiconductor sheets;

a second transistor of the SRAM cell over the first transistor, the second transistor comprising:

second semiconductor sheets; and a first source/drain region interfacing first sidewalls of the second semiconductor sheets;

a third transistor of the SRAM cell laterally adjacent to the first transistor; and a fourth transistor of the SRAM cell over the third transistor, the fourth transistor comprising:

third semiconductor sheets;

second source/drain region interfacing second sidewalls of the third semiconductor sheets; and a second gate structure surrounding each of the third semiconductor sheets, wherein from a top view, a first dimension of one of the first semiconductor sheets in a lengthwise direction of the first gate structure is less than a second dimension of one of the third semiconductor sheets in the lengthwise direction of the first gate structure, and wherein the second transistor is a pull-down transistor and the fourth transistor is a pass-gate transistor, and from the top view, a dimension of the second source/drain region is greater than a dimension of the first source/drain region in the lengthwise direction of the first gate structure.

10. The semiconductor structure of claim 9, wherein from the top view, the one of the first semiconductor sheets has a first side extending along a first direction perpendicular to the lengthwise direction of the first gate structure, the one of the third semiconductor sheets has a second side extending along the first direction, the first side is inward relative to the second side in the lengthwise direction of the first gate structure.

11. The semiconductor structure of claim 9, wherein the first transistor is a pull-up transistor.

12. The semiconductor structure of claim 9, wherein, from the top view, the dimension of the second source/drain region is about 1.1 to about 2 times the dimension of the first source/drain region in the lengthwise direction of the first gate structure.

13. The semiconductor structure of claim 9, further comprising a metal line extending in a lengthwise direction of the first semiconductor sheets and overlapping the second and third semiconductor sheets of the second transistor and the fourth transistor, wherein, from the top view, a dimension of the metal line is greater than a dimension of the second semiconductor sheets of the second transistor and less than a dimension of the third semiconductor sheets of the fourth transistor in the lengthwise direction of the first gate structure.

14. A method, comprising:

forming a first bottom-tier transistor, the first bottom-tier transistor comprising a first channel layer and a first gate structure around the first channel layer;

forming a second bottom-tier transistor, the second bottom-tier transistor comprising a second channel layer and a second gate structure around the second channel layer, the first and second bottom-tier transistors sharing a first same source/drain region, wherein from a top view, a first dimension of the first channel layer in a lengthwise direction of the first gate structure is less than a second dimension of the second channel layer in the lengthwise direction of the first gate structure;

forming a first top-tier transistor over the first bottom-tier transistor, the first top-tier transistor comprising a third channel layer and being a pull-down transistor;

forming a second top-tier transistor over the second bottom-tier transistor, the first and second top-tier transistors sharing a second same source/drain region the second top-tier transistor comprising a fourth channel layer and being a pass-gate transistor; and forming a metal line extending in a lengthwise direction of the third channel layer and overlapping the third channel layer and the fourth channel layer, wherein, from the top view, the metal line has a third dimension greater than a fourth dimension of the third channel layer and less than a fifth dimension of the fourth channel layer in the lengthwise direction of the first gate structure.

15. The method of claim 14, wherein the first bottom-tier transistor is a pull-up transistor.

16. The method of claim 14, wherein from the top view, the fourth dimension of the third channel layer of the first top-tier transistor in the lengthwise direction of the first gate structure is less than the second dimension of the second channel layer of the second bottom-tier transistor.

17. The method of claim 16, wherein the fourth dimension of the third channel layer of the first top-tier transistor is the same as the first dimension of the first channel layer of the first bottom-tier transistor.

18. The method of claim 14, wherein from the top view, the fifth dimension of the fourth channel layer of the second top-tier transistor in the lengthwise direction of the first gate structure is greater than the first dimension of the first channel layer of the first bottom-tier transistor.

19. The method of claim 14, further comprising:

forming a first source/drain epitaxial structure connected to the third channel layer of the first top-tier transistor; and forming a second source/drain epitaxial structure connected to the fourth channel layer of the second top-tier transistor, wherein, from the top view, a dimension of the second source/drain epitaxial structure is greater than a dimension of the first source/drain epitaxial structure in the lengthwise direction of the first gate structure.

20. The method of claim 14, wherein the fifth dimension of the fourth channel layer is about 1.1 to about 2 times the fourth dimension of the third channel layer.

* * * * *